(12) United States Patent
Jovanovic

(10) Patent No.: US 10,635,757 B2
(45) Date of Patent: *Apr. 28, 2020

(54) METHOD FOR REPLACING 3D OBJECTS IN 2D ENVIRONMENT

(71) Applicant: Atheer, Inc., Mountain View, CA (US)

(72) Inventor: Milos Jovanovic, Portland, OR (US)

(73) Assignee: Atheer, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/921,579

(22) Filed: Mar. 14, 2018

(65) Prior Publication Data

US 2018/0203951 A1 Jul. 19, 2018

Related U.S. Application Data

(63) Continuation of application No. 14/710,565, filed on May 12, 2015, now Pat. No. 9,971,853.

(Continued)

(51) Int. Cl.
| | |
|---|---|
| *G06F 17/50* | (2006.01) |
| *G06T 13/20* | (2011.01) |
| *G06T 15/10* | (2011.01) |
| *G06T 15/20* | (2011.01) |
| *G06T 19/00* | (2011.01) |
| *G06T 19/20* | (2011.01) |
| *G06F 3/0481* | (2013.01) |
| *G06F 3/0484* | (2013.01) |
| *G06F 3/0486* | (2013.01) |
| *G06F 3/0488* | (2013.01) |

(52) U.S. Cl.
CPC ............ *G06F 17/50* (2013.01); *G06F 3/0486* (2013.01); *G06F 3/0488* (2013.01); *G06F 3/04815* (2013.01); *G06F 3/04845* (2013.01); *G06F 17/5004* (2013.01); *G06T 13/205* (2013.01); *G06T 15/10* (2013.01); *G06T 15/20* (2013.01); *G06T 19/006* (2013.01); *G06T 19/20* (2013.01); *G06F 2203/04802* (2013.01); *G06T 2215/12* (2013.01); *G06T 2215/16* (2013.01); *G06T 2219/004* (2013.01); *G06T 2219/008* (2013.01); *G06T 2219/012* (2013.01); *G06T 2219/2004* (2013.01); *G06T 2219/2008* (2013.01); *G06T 2219/2012* (2013.01); *G06T 2219/2016* (2013.01); *G06T 2219/2024* (2013.01)

(58) Field of Classification Search
CPC .. G06F 17/50; G06F 3/04815; G06F 17/5004; G06T 13/205; G06T 19/006
USPC ....................................................... 345/427
See application file for complete search history.

(56) References Cited

U.S. PATENT DOCUMENTS

| | | |
|---|---|---|
| 6,532,021 B1 | 3/2003 | Tognazzini et al. |
| 6,771,276 B1 | 8/2004 | Highsmith et al. |
| | (Continued) | |

*Primary Examiner* — Grace Q Li
(74) *Attorney, Agent, or Firm* — Miller IP Law, LLC

(57) ABSTRACT

Example systems and methods for virtual visualization of a three-dimensional (3D) model of an object in a two-dimensional (2D) environment. The method may include superimposing a first 3D model of an object onto the 2D environment, and replacing the first 3D model of the object with a second 3D model of an object. Further, the method may include superimposing a smart 3D model of an object onto the 2D environment. Additionally, the method may include a code or mark to identify images of the 2D environment to which 3D models of objects have been superimposed.

20 Claims, 11 Drawing Sheets

Related U.S. Application Data

(60) Provisional application No. 61/992,759, filed on May 13, 2014, provisional application No. 61/992,629, filed on May 13, 2014, provisional application No. 61/992,719, filed on May 13, 2014, provisional application No. 61/992,774, filed on May 13, 2014, provisional application No. 61/992,746, filed on May 13, 2014, provisional application No. 61/992,665, filed on May 13, 2014.

(56) References Cited

U.S. PATENT DOCUMENTS

| | | |
|---|---|---|
| 6,809,745 B1 | 10/2004 | O'Donnell et al. |
| 6,891,533 B1 | 5/2005 | Alcorn et al. |
| 6,912,293 B1 | 6/2005 | Korobkin |
| 7,043,695 B2 | 5/2006 | Elber et al. |
| 7,062,722 B1 | 6/2006 | Carlin et al. |
| 7,277,572 B2 | 10/2007 | MacInnes et al. |
| 7,425,958 B2 | 9/2008 | Berger et al. |
| 7,523,411 B2 | 8/2009 | Carlin |
| 7,583,275 B2 | 9/2009 | Neumann et al. |
| 9,092,053 B2 | 7/2015 | Kerr et al. |
| 9,129,433 B1 | 9/2015 | Korobkin |
| 9,317,959 B2 | 4/2016 | Densham |
| 9,317,962 B2 | 4/2016 | Morato et al. |
| 9,330,503 B2 | 5/2016 | Mital et al. |
| 9,514,573 B2 | 12/2016 | Grimaud |
| 9,659,406 B2 | 5/2017 | Arcas et al. |
| 2004/0105573 A1 | 6/2004 | Neumann et al. |
| 2005/0002662 A1 | 1/2005 | Arpa et al. |
| 2007/0098290 A1 | 5/2007 | Wells |
| 2007/0124215 A1 | 5/2007 | Simmons, Jr. |
| 2008/0222503 A1 | 9/2008 | Sandige et al. |
| 2009/0113349 A1 | 4/2009 | Zohar et al. |
| 2009/0125801 A1 | 5/2009 | Algreatly |
| 2009/0243957 A1 | 10/2009 | Ni et al. |
| 2009/0254843 A1 | 10/2009 | Van Wie et al. |
| 2010/0208057 A1 | 4/2010 | Meier et al. |
| 2010/0194863 A1 | 8/2010 | Lopes et al. |
| 2010/0208033 A1 | 8/2010 | Edge et al. |
| 2010/0289817 A1 | 11/2010 | Meier et al. |
| 2011/0188760 A1 | 8/2011 | Wright et al. |
| 2012/0086727 A1 | 4/2012 | Korah et al. |
| 2012/0105581 A1 | 5/2012 | Berestov et al. |
| 2012/0120113 A1 | 5/2012 | Hueso |
| 2012/0169847 A1 | 7/2012 | Lee et al. |
| 2012/0182286 A1 | 7/2012 | Wang |
| 2012/0183204 A1 | 7/2012 | Aarts et al. |
| 2013/0002649 A1 | 1/2013 | Wu et al. |
| 2013/0135303 A1 | 5/2013 | Densham |
| 2013/0187905 A1 | 7/2013 | Vaddadi et al. |
| 2013/0212538 A1 | 8/2013 | Lemire et al. |
| 2013/0326583 A1 | 12/2013 | Freihold et al. |
| 2014/0104315 A1 | 4/2014 | Kapler et al. |
| 2014/0176537 A1 | 6/2014 | Densham |
| 2015/0035823 A1 | 2/2015 | Arsan et al. |
| 2015/0049086 A1 | 2/2015 | Morato et al. |
| 2015/0062125 A1 | 3/2015 | Aguilera Perez et al. |
| 2015/0170260 A1 | 6/2015 | Lees et al. |
| 2015/0310662 A1 | 10/2015 | Arcas et al. |
| 2015/0332504 A1 | 11/2015 | Wang et al. |
| 2015/0332505 A1 | 11/2015 | Wang et al. |
| 2016/0071325 A1* | 3/2016 | Callaghan ............ G06T 19/006 345/633 |
| 2019/0289421 A1* | 9/2019 | Koga ..................... H04S 7/304 |

* cited by examiner

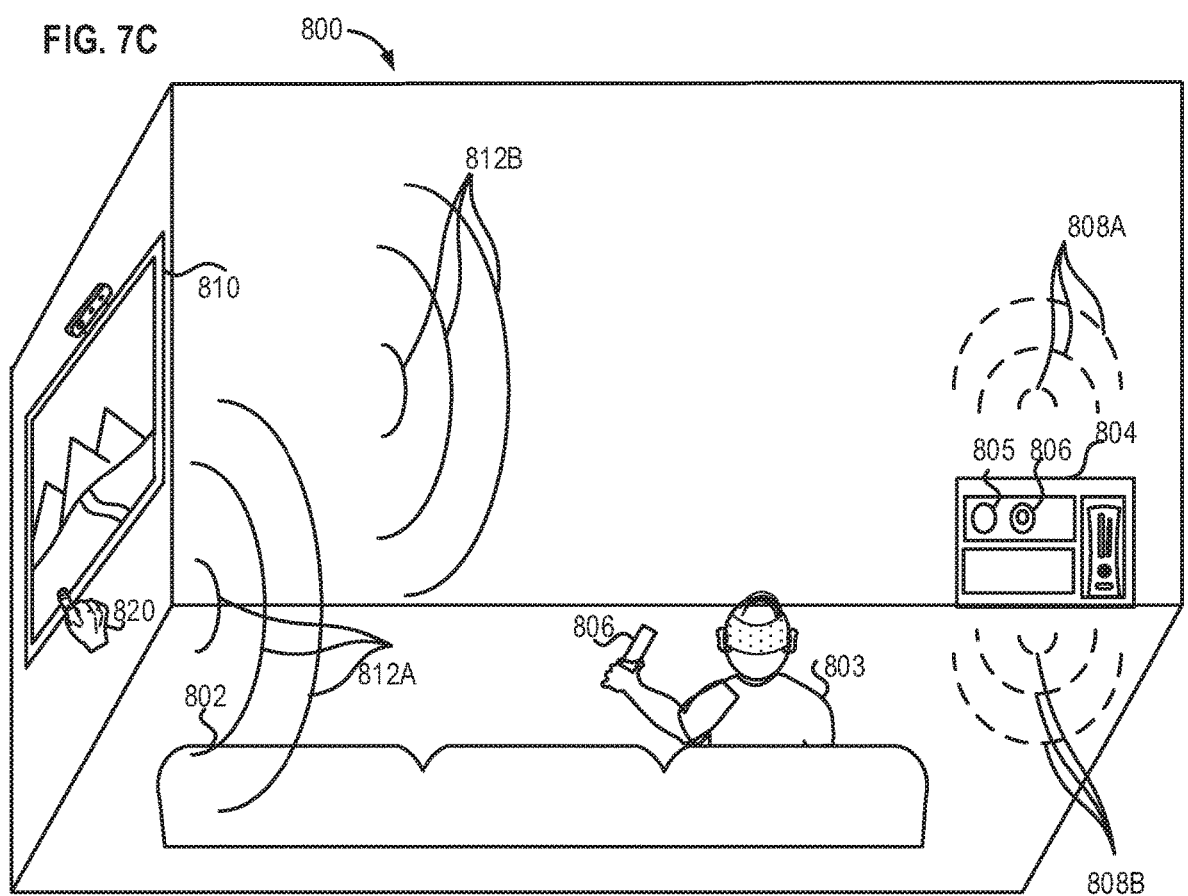

METHOD FOR REPLACING 3D OBJECTS IN 2D ENVIRONMENT

CROSS-REFERENCE TO RELATED APPLICATIONS

The present application is a continuation of U.S. Non-Provisional application Ser. No. 14/710,565 entitled "METHOD FOR REPLACING 3D OBJECTS IN 2D ENVIRONMENT" filed on May 12, 2015. U.S. Non-Provisional application Ser. No. 14/710,565 claims priority to U.S. Provisional Patent Application No. 61/992,759 entitled "METHOD FOR FORMING WALLS TO ALIGN 3D OBJECTS IN 2D ENVIRONMENT", filed on May 13, 2014. U.S. Non-Provisional application Ser. No. 14/710,565 also claims priority to U.S. Provisional Patent Application No. 61/992,629 entitled "METHOD FOR PROVIDING SCALE TO ALIGN 3D OBJECTS IN 2D ENVIRONMENT", filed on May 13, 2014. U.S. Non-Provisional application Ser. No. 14/710,565 claims further priority to U.S. Provisional Patent Application No. 61/992,719 entitled "METHOD FOR PROVIDING A PROJECTION TO ALIGN 3D OBJECTS IN 2D ENVIRONMENT", filed May 13, 2014. U.S. Non-Provisional application Ser. No. 14/710,565 claims further priority to U.S. Provisional Patent Application No. 61/992,774 entitled "METHOD FOR MOVING AND ALIGNING 3D OBJECTS IN A PLANE WITHIN THE 2D ENVIRONMENT", filed May 13, 2014. U.S. Non-Provisional application Ser. No. 14/710,565 claims further priority to U.S. Provisional Patent Application No. 61/992,746 entitled "METHOD FOR REPLACING 3D OBJECTS IN 2D ENVIRONMENT", filed May 13, 2014. U.S. Non-Provisional application Ser. No. 14/710,565 claims further priority to U.S. Provisional Patent Application No. 61/992,665 entitled "METHOD FOR INTERACTIVE CATALOG FOR 3D OBJECTS WITHIN THE 2D ENVIRONMENT", filed May 13, 2014. The entire contents of each of the above-listed applications are hereby incorporated by reference for all purposes.

BACKGROUND AND SUMMARY

Interior design may involve developing and evaluating a design for a room or environment. For example, a designer may wish to position various objects, including furniture, lighting fixtures, and wall hangings, within a two-dimensional (2D) environment of an interior room. Conventional interior design tools may enable a user to first form a three-dimensional (3D) modeled space, representing the 2D environment and then position a 3D modeled objects within the 3D modeled space. Another option is to use a scrapbook method and form a collection of 2D images of products one would like to visualize in the 2D environment.

The inventors herein have recognized various issues with the above methods. Namely, although objects may be positioned independently within the 2D environment, it may be difficult to precisely replace an object in the 2D environment.

One example embodiment, may include a method for replacing the 3D model of the object in the environment, comprising selecting a first 3D object in the 2D environment, selecting a second 3D object from a library of 3D objects and replacing the first 3D object with the second 3D object. For example, if the user is trying to decide whether a round table or a rectangular table may fit better within the user's living space (the 2D environment), the user may superimpose the round table on the living space and then, replace the round table with the rectangular table. After visualizing both the tables in the living space, the user may finalize his choice.

Another example embodiment, may include a method comprising replacing a 3D object in a 2D environment, comprising, selecting the plane, such as a wall plane or a ground plane or a top plane, selecting a 3D object positioned in one of those planes and replacing the selected 3D object with a new 3D object belonging to the same plane as the selected object.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

FIGS. 7A, 7B, and 7C illustrate an example of a smart 3D model of an object in the 2D environment.

DETAILED DESCRIPTION

Figure 1:
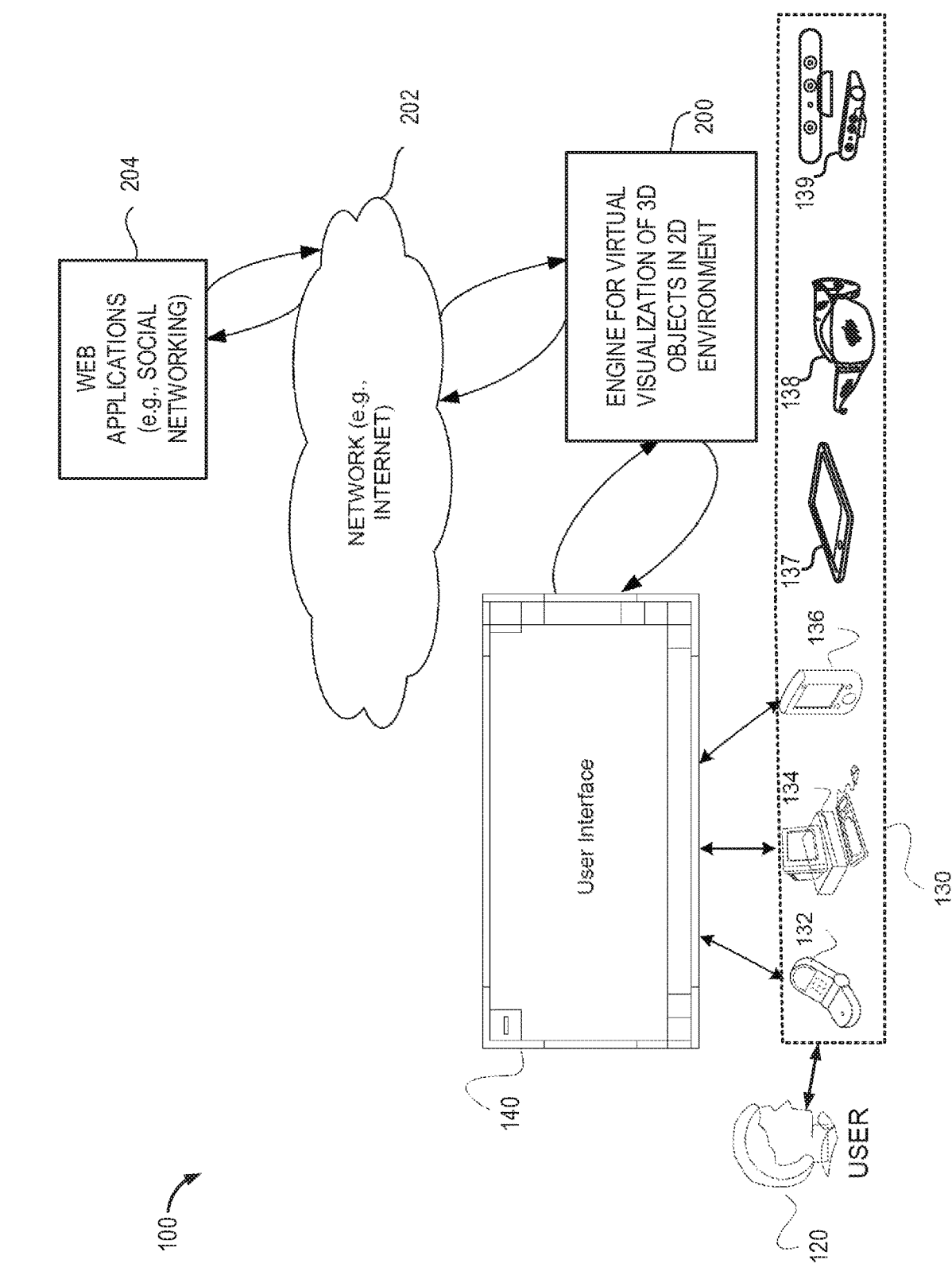
FIG. 1 is a block diagram illustrating the overall system for visualization of 3D models of objects in a 2D environment, in accordance with various embodiments.

The present description relates to visualization and adding of 3D models of objects to a 2D environment, wherein the 2D environment is a real environment represented by a photo or video and other graphical representations. A user may import photographic images, digital images, video images, and other graphical representations of the 2D environment. Further, the 2D environment may include existing graphical materials or graphical materials captured as a still image or a live feed image. The 2D environment may serve as the background environment for adding a 3D model of an object.

The 3D object is associated with a set of data which includes a defined set of parameters relevant to the 3D object. The parameters may include attributes, instructions, and other such scripts associated with and essential for graphical use of the 3D object. Characteristics of the 3D object, interaction between object entities may be analyzed with such associated data. The set of data associated with the 3D object may include geometric attributes, depth value, color value, and such other properties. For example, geometric attributes of the 3D object, such as a chair, may include height and width information. If a user decides to place the chair near a table, already present in the 2D environment, the height and width information for the chair may help the user in precise aligning.

The object information data may also include metadata encoding one or more of a set of parameters relevant to the 3D object, manufacturer's guidelines, regulations and guidelines governing the 3D object, safety guidelines for the 3D object, and any other relevant information specific to the 3D object.

The object information data may include metadata defining the behavior of the 3D object within the 2D environment. For example, a 3D object may include metadata defining an object as one of a wall object, ceiling object, floor object, or combination thereof. The metadata may further define the placement and movement of the object within the environment.

The object information data may also include metadata encoding an information tag. The information tag may include a description of the 3D object including dimensions, materials, cost, manufacturer, and other information specific to the 3D object discussed below.

The object information data may also include metadata encoding graphical data, spatial data, and other rendering data for superimposing the 3D object within the 2D environment. Graphical, spatial, and rendering data may be processed by a computing device to generate and display the 3D object to the user.

The parameters may include attributes, instructions, behavior characteristics, visualizations to be displayed by the 3D object, and other such scripts associated and essential for graphical use of the 3D object. For example, the parameters may include, but are not limited to, the physical dimensions of the 3D object, mounting requirements for the 3D object, metadata identifying the 3D object as a floor object, wall object, ceiling object, or combination thereof, power requirements, length of a power cord, and any other relevant information describing the 3D object.

Additionally, the object information data may include additional parameters such as manufacturer's guidelines and/or safety guidelines for safe and proper installation and operation of the 3D object. For example, the object information data may include metadata encoding a minimum clearance or spatial requirement surrounding the 3D object. The minimum clearance/spatial requirement may be required for adequate ventilation of the 3D object, prevention of fire hazards, noise control, clearance of moving parts of the 3D object, or to satisfy any other personal safety, medical safety, or industrial safety standard. As an example, a display may require 6 inches clear from the cooling fan gratings to allow for proper airflow to cool the electric internals within the display. As another example, in a medical application, a magnetic resonance imager may generate an electro-magnetic field in an area surrounding the magnetic resonance imager that may interfere with other electrically powered or magnetically sensitive medical equipment, personal medical equipment such as a pacemaker, and any magnetic material that may be drawn to the magnetic resonance imager by magnetic attraction. In an industrial application, some industrial equipment have moving or rotating parts that may extend past the main body of the piece of industrial equipment. Therefore, to allow for proper operation of the industrial equipment, other equipment or objects may be located outside a minimum clearance or spatial requirement surrounding the piece of industrial equipment.

In another example, in a restaurant environment, the tables, chairs, and other objects within the restaurant space may be required to be arranged such that a minimum clearance surrounding each object is maintained and that pathways for traversal are maintained clear and of sufficient dimensions to meet federal and local accommodation codes. Therefore, each chair and each table may include a minimum clearance or spatial requirement surrounding the table or chair to meet the governing guidelines.

In another example, in a retail environment, retail display fixtures may be arranged within the retail space such that a minimum clearance surrounding each fixture may be maintained to allow shoppers to easily move within the retail space and to meet federal and local accommodation codes. In addition to satisfaction of the governing access codes, the 3D models of the display fixtures and accompanying merchandise may be arranged within the 2D image of the retail space allowing retail planners to efficiently design retail merchandising plans, design retail exhibit plans, and then electronically distribute the design plans to the stores. Further, the retail merchandising teams at the stores may propose amendments to the design plans that are specific to the available retail space within the store accounting for differences due to the specific architectural design of the store space. These amendments may then be reviewed and approved by the retail planners, thereby providing an advantage of an efficient and electronic means of distributing, amending, and approving retail merchandising plans.

The object information data may be provided by multiple sources, including but not limited to, one or more of the manufacturer of the 3D object, government safety regulations such as provided by the Occupational Safety and Health Administration or other Federal or local governing body, federal and local accommodation codes such as the Americans with Disabilities Act and federal, state, and local fire codes, the user may provide the object information data, object information data may be downloaded from a remote data base, encoded by an asset manager or managing service providing the 3D objects, or any other suitable means. It will be appreciated that the listed sources of object information data are not intended to be limiting.

In some embodiments, the object information data may include one or more spatial requirements. The spatial requirements may exceed the geometric dimensions of the 3D object and govern interactions between the 3D object and other object entities. The spatial requirements of a 3D object may be specific to the object based upon one or more of a manufacturer's recommendation, imported from a remote database, government regulation, configured by the user, or any other suitable source.

In some embodiments, the two-dimensional environment may also include environmental information data. The environmental information data may include metadata which may encode one or more of a set of properties relevant to the 2D environment, regulations and guidelines governing the 2D environment such as governing access regulations, industrial safety standards, and governing fire codes, safety guidelines for the 2D environment, and any other relevant information specific to the 2D environment. The properties encoded by environmental information data may include one or more of the dimensions of the 2D environment, characteristics of the 2D environment governing the behavior and movement of 3D objects within the 2D environment, locations of power supplies and the voltage and frequency supplied, construction information such as location of load bearing members, allowable load information, construction materials, available ventilation, acoustic information, fixed lighting sources, and any other information relevant to the two-dimensional environment.

The environmental information data may be provided by multiple sources such as one or more of government safety regulations such as provided by the Occupational Safety and Health Administration or other Federal or local governing body, federal and local accommodation codes such as the Americans with Disabilities Act and federal, state, and local fire codes, the user may provide the object information data, object information data may be downloaded from a remote data base, encoded by an asset manager or managing service providing the 3D objects, or any other suitable means.

In these embodiments properties of the 2D environment may be retrieved from the environmental information data and analyzed to determine interaction with 3D objects within the 2D environment. As a non-limiting example, one or more threshold barriers between two planes of the 2D environment may be adjusted to satisfy one or more conditions encoded in the metadata of both the environmental information data and the object information data.

In some embodiments, the physical properties of the 3D object, interaction between object entities, and interactions between object entities and the 2D environment may be analyzed with such associated data.

As the data associated with the 3D object is transferred to the 2D environment, the 3D object may be visualized in the 2D environment with respect to scale and perspective of the 2D environment. The 2D environment including the 3D object may be referred to as a modeled 2D environment. Within the 2D environment, the user may move the 3D object in a vertical direction, horizontal direction, or in a rotational manner. For example, if the 3D object is a display, the user may move the display in a vertical or horizontal manner on a wall plane of the 2D environment; whereas, if the 3D object is a chair on a ground plane of the 2D environment, the user may move the chair in a horizontal or rotational manner.

A non-limiting example of a 3D object may be a display. The display may be any of a television, monitor, computer monitor, or visual array including, but not limited to, a liquid crystal display (LCD), light emitting diode (LED) display, organic light emitting diode (OLED) display, cathode based display, or any other display device capable of providing a visual image to a viewer. The display may be comprise any of a plurality of shapes, such as square, rectangular, curved, round, or any suitable geometric shape. Further, the display may include a support frame, may be frameless, or any other structural form factor known in the art. The display may be a stand-alone display or one of a plurality of display units comprising a composite display including multiple display units.

Additionally, the user may be connected to various social networking services and/or microblogs, such as Facebook™, Twitter™, and other such networking services. Connection to social networking services and/or microblogs may allow user to interact with his contacts to share and obtain opinion and feedback on image obtained after placing 3D objects in 2D environment. Further, the user may also request help from designing services to arrange 3D objects within a given 2D environment.

Visualization and addition of 3D objects to any 2D environment provides ample opportunities in various spheres of human life. Spatial representation of 3D objects may help in comprehending and learning, designing and drafting, efficient space management, and accelerated decision making and planning. The ability to represent virtual 3D objects in a real environment can provide further applications, such as selecting furniture for a house, designing kitchen cabinets, selecting display and presentation equipment for conference rooms, presentation layouts for tradeshow booths, industrial planning and industrial equipment placement, medical equipment placement, and other space and design applications.

Figure 2:
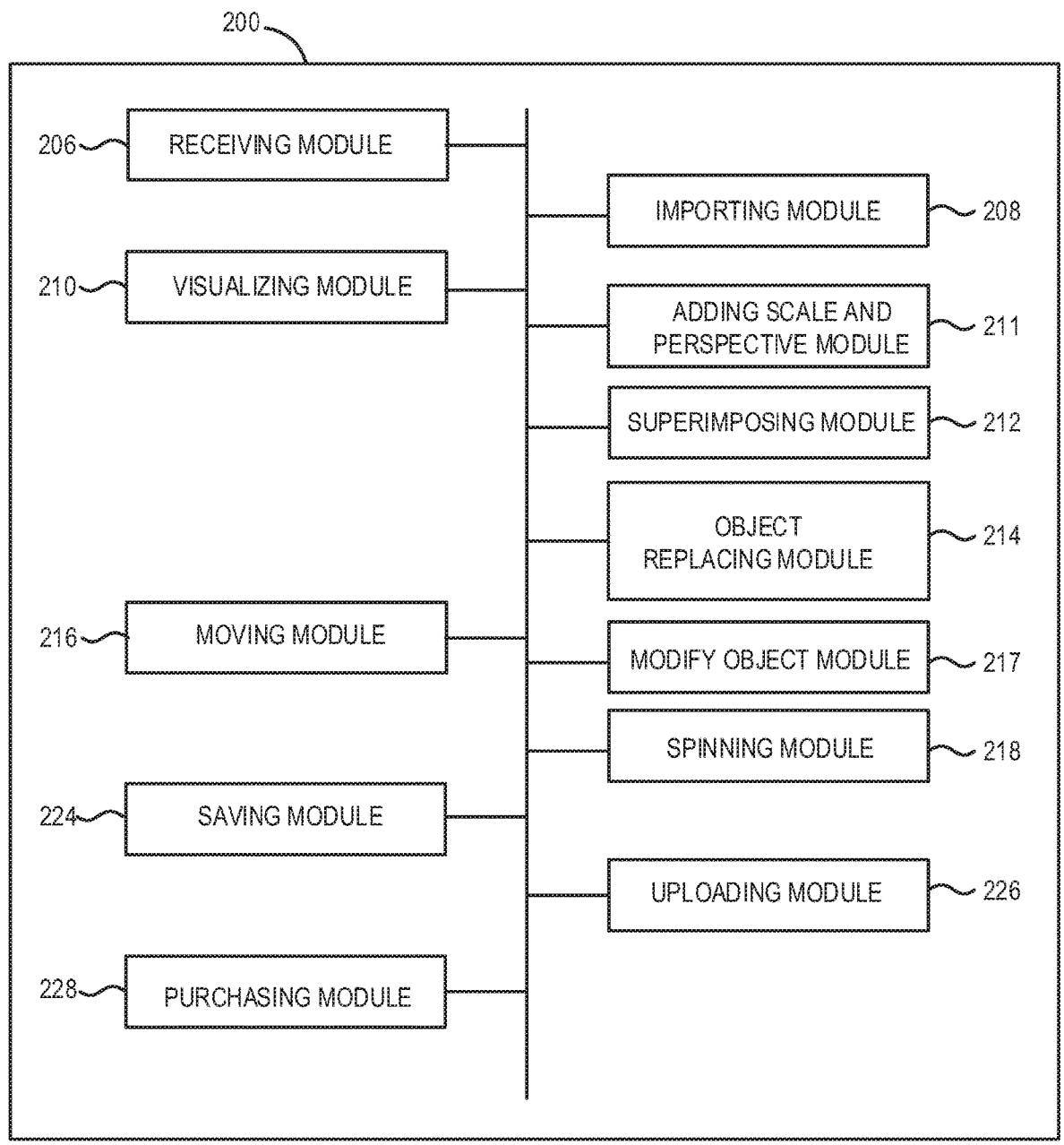
FIG. 2 is a block diagram showing various modules of an engine for visualization of 3D models of objects in the 2D environment, in accordance with various embodiments.
Figure 3A:
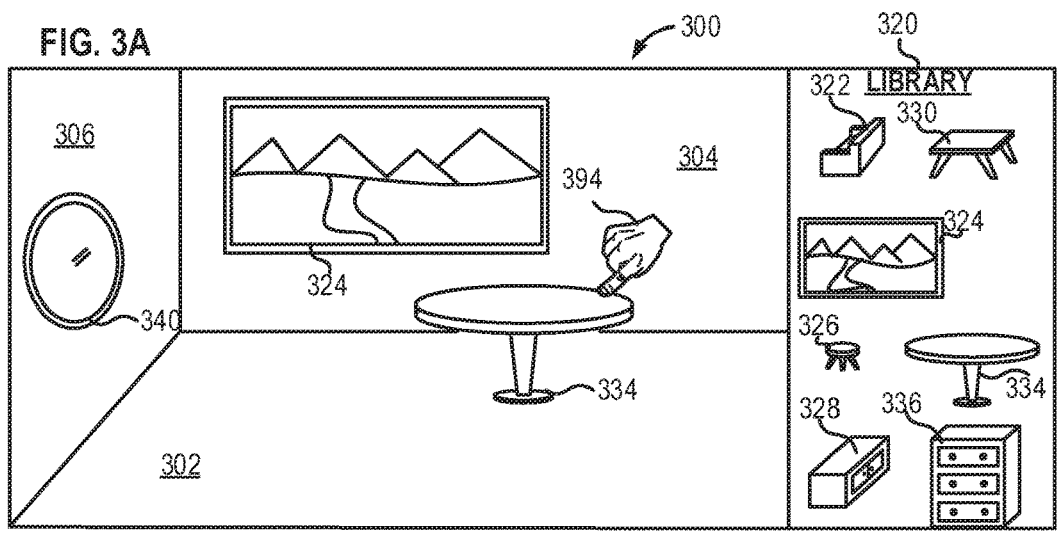
FIGS. 3A, 3B and 3C are example representations of a 2D environment.
Figure 3B:
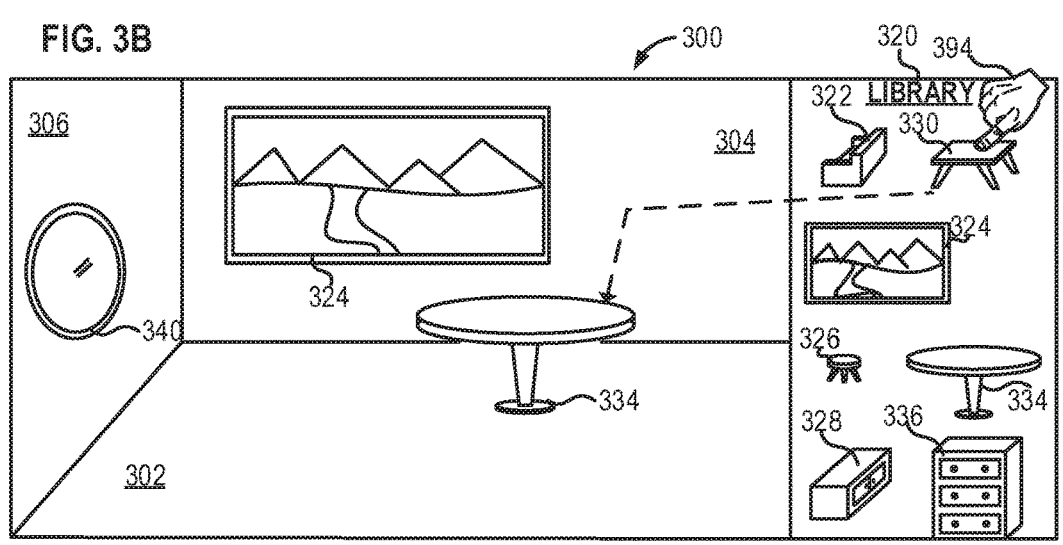
Figure 3C:
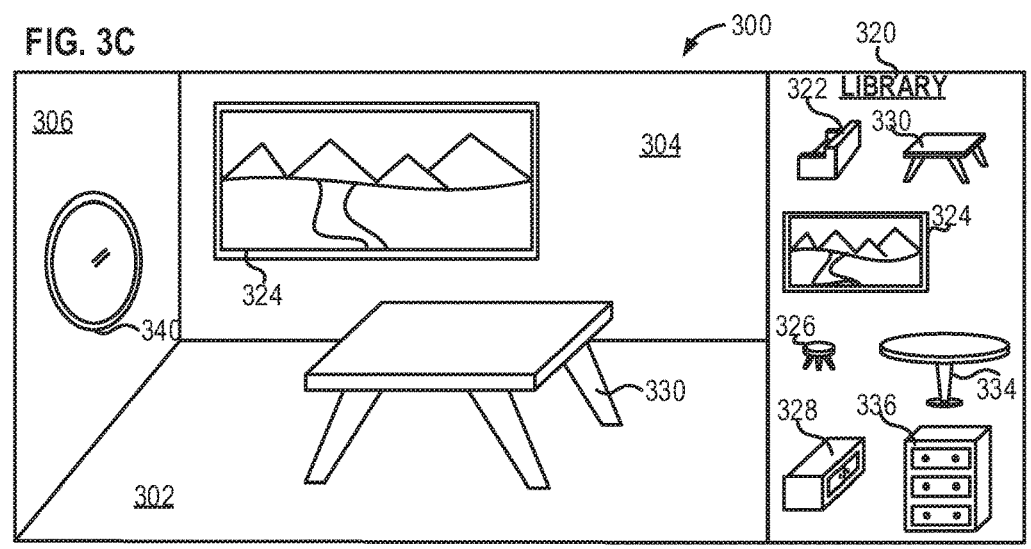
Figure 4:
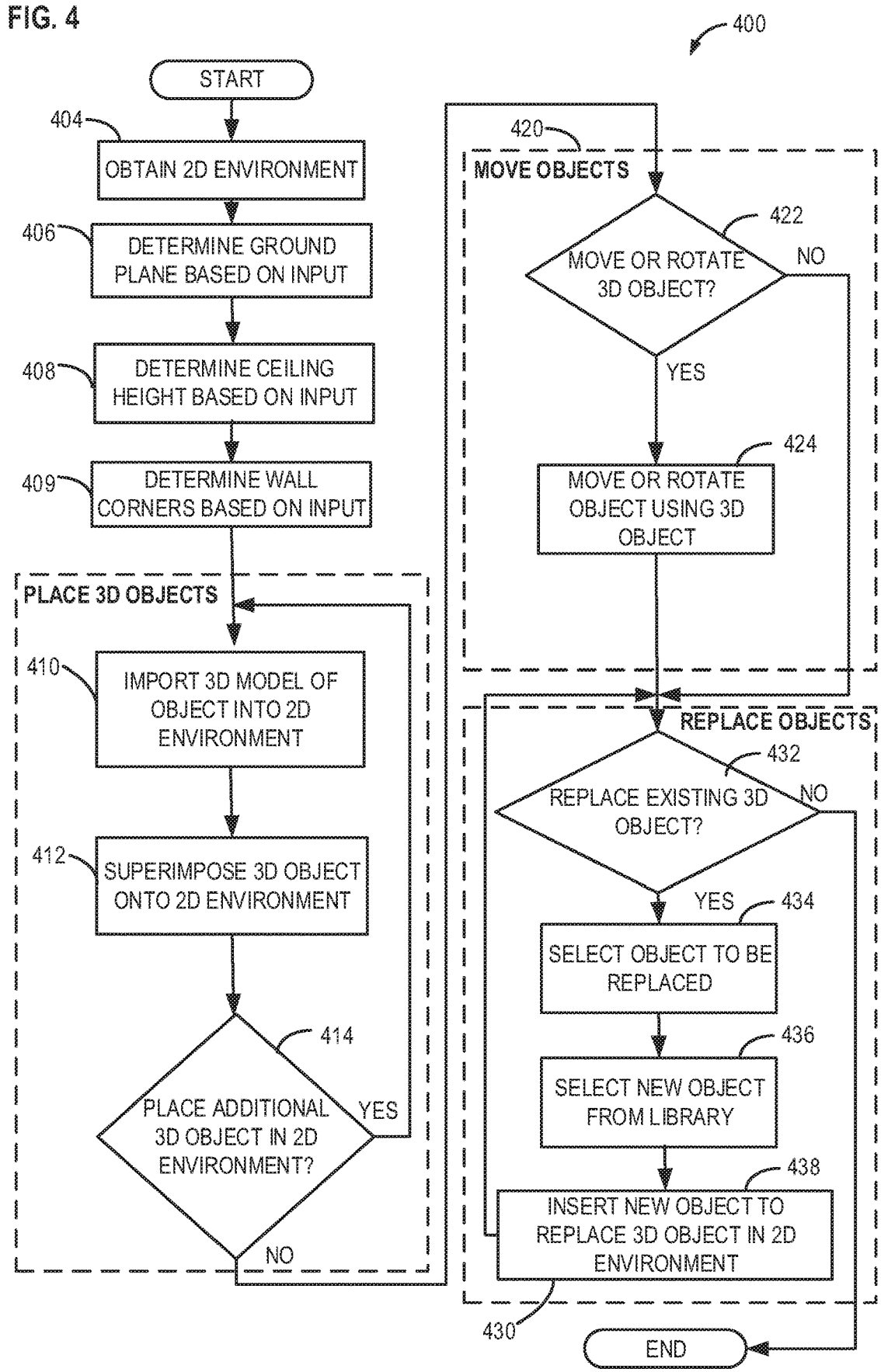
FIG. 4 is an example flowchart for a method of replacing an object in the 2D environment.
Figure 5:
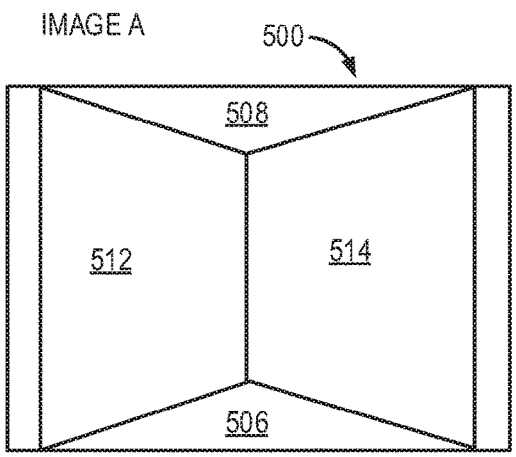
FIG. 5 illustrates a method to distinguish between an image of the 2D environment, with or without addition of scale and perspective, and superimposed 3D models of object.
Figure 5:
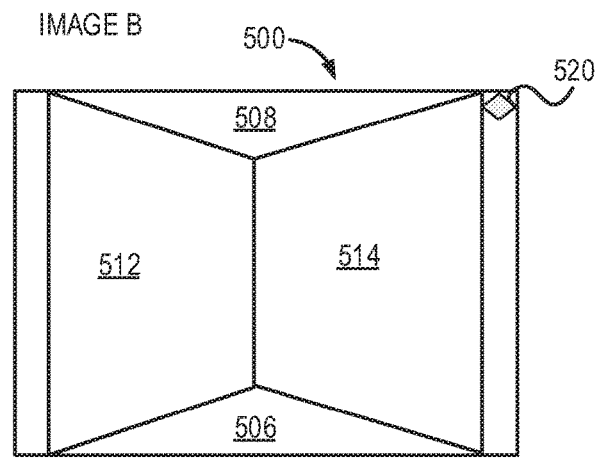
Figure 5:
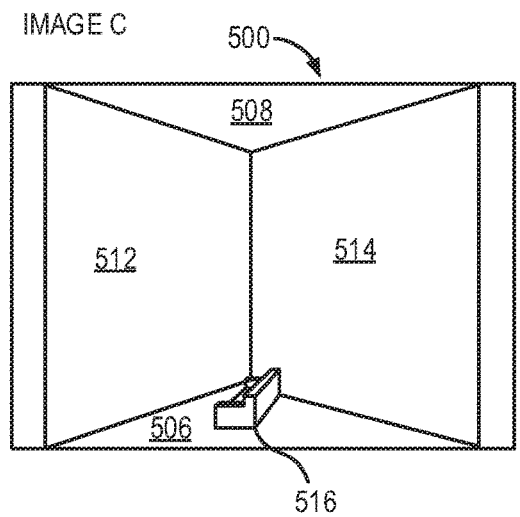
Figure 5:
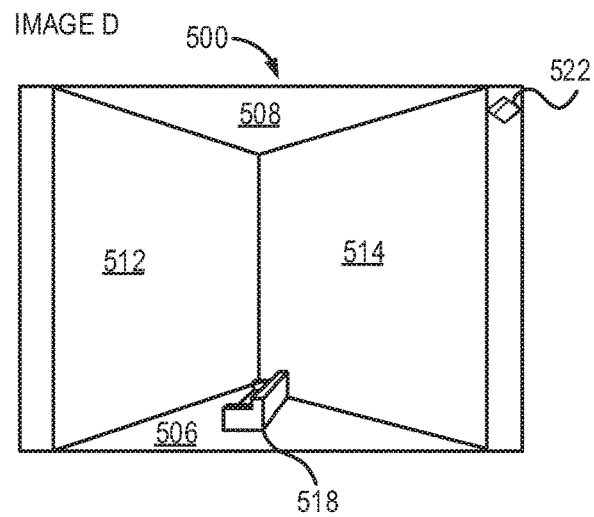

FIG. 1 is a block diagram illustrating the overall system for visualization of 3D models of objects in a 2D environment, in accordance with various embodiments of the present application. FIG. 1B is a schematic illustration of a system for visualization of 3D model of objects in a 2D environment. FIG. 2 is a block diagram showing various modules of an engine for visualization of 3D models of objects in the 2D environment. FIGS. 3A, 3B and 3C are example representations of the 2D environment. FIG. 4 is an example flowchart for a method of replacing an object in the 2D environment. FIG. 5 illustrates a method to distinguish between an image of the 2D environment, with or without addition of scale and perspective, and superimposed 3D model of objects. FIGS. 6A, 6B, 6C and 6D are example representations of the 2D environment. FIG. 7 illustrates an example of a smart 3D model of an object in the 2D environment 800. FIG. 8 illustrates an example of a computer network system, in which various embodiments may be implemented.

FIG. 1 illustrates a block diagram of an overall system 100 for visualization of 3D objects in a 2D environment, in accordance with various embodiments of the present disclosure. Overall system 100 may include a user 120, user devices 130, a user interface 140, an engine 200 for virtual visualization of 3D models of objects in 2D environment, a network 202, and various web applications 204. The user devices 130 may include a mobile phone 132, a personal computer (PC) 134, a personal digital assistant (PDA) 136, a tablet PC 137, a wearable computer device 138 such as Google Glass™ and Recon Jet™, a 3D scanner 139 and the like. The user 120 via user devices 130 interacts with the user interface 140. The user may also directly interact with the user interface via touchscreen, keyboard, mouse key, touch pad and the like. The engine 200 for visualization of 3D objects in 2D environment may comprise of local device-based, network-based, or web-based service available on any of the user devices 130. The user may further interact with the web applications 204. The web applications may include social networking services.

The user 120 may interact with the user interface 140 via the user devices 130. The system for virtual visualization of 3D models of objects in 2D environment 300 may be implemented on a local device or via a network-based or web-based service accessible via user devices 130. The user 140 may periodically interact with the system for virtual visualization of 3D models of objects in 2D environment 300 via the user interface 140 displayed using one of the user devices 130. Additionally, the user 120 may periodically interact with the web application such as a social networking service (including social networks, microblogs, web blogs, and other web resources) via the system for virtual visualization of 3D models of objects in 2D environment 300 and the network 202 to upload graphics obtained using the system for virtual visualization of 3D models of objects in 2D environment 300, communicate with members of the social networking service, and so forth.

The user devices 130, in some example embodiments, may include a Graphical User Interface (GUI) for displaying the user interface 140. In a typical GUI, instead of offering only text menus or requiring typed commands, the system 200 may present graphical icons, visual indicators, or graphical elements called widgets that may be utilized to allow the user 120 to interact with the user interface 140. The user devices 130 may be configured to utilize icons in conjunction with text, labels, or text navigation to fully represent the information and actions available to users.

The network 202 may include the Internet or any other network capable of communicating data between devices. Suitable networks may include or interface with one or more of, for instance, a local intranet, a Personal Area Network (PAN), a Local Area Network (LAN), a Wide Area Network (WAN), a Metropolitan Area Network (MAN), a virtual private network (VPN), a storage area network (SAN), an Advanced Intelligent Network (AIN) connection, a synchronous optical network (SONET) connection, Digital Subscriber Line (DSL) connection, an Ethernet connection, an Integrated Services Digital Network (ISDN) line, a cable modem, an Asynchronous Transfer Mode (ATM) connection, or an Fiber Distributed Data Interface (FDDI) or Copper Distributed Data Interface (CDDI) connection. Furthermore, communications may also include links to any of a variety of wireless networks, including Wireless Application Protocol (WAP), General Packet Radio Service (GPRS), Global System for Mobile Communication (GSM), Code Division Multiple Access (CDMA) or Time Division Multiple Access (TDMA), cellular phone networks, Global Positioning System (GPS), Cellular Digital Packet Data (CDPD), Research in Motion (RIM), limited duplex paging network, Bluetooth radio, or an IEEE 802.11-based radio frequency network. The network 202 may further include or interface with any one or more of an RS-232 serial connection, an IEEE-1394 (Firewire) connection, a Fiber Channel connection, an IrDA (infrared) port, a Small Computer Systems Interface (SCSI) connection, a Universal Serial Bus (USB) connection or other wired or wireless, digital or analog interface or connection, mesh. The network 202 may be a network of data processing nodes that are interconnected for the purpose of data communication.

A 2D environment may be provided including a 2D image. The 2D image may be a photograph, line drawing or video. For example, the 2D image may be a picture of a room or part of a room. The 2D image may be a personalized image captured by a user's hand-held device or other computing device. In other examples, the 2D image may be saved or imported from a storage device on a remote server or other device.

Perspective and scale may be added to the 2D image. The perspective and scale may be saved as part of the image such that the 2D image is now a combined image having both the 2D information and perspective and scale information associated with the 2D image.

In some examples and as described in more detail herein, walls may be selectively positioned within the image. Further, in some examples, a 3D object may then be positioned within the 2D image with perspective and scale overlay, combined image. The 3D object may be realistically positioned within the resulting image based on the perspective and scale overlay information. Further, the 3D object may be positioned within resulting image such that the 3D object may be perceived in three dimensions within the 2D environment.

FIG. 2 illustrates a block diagram for the engine for virtual visualization of 3D models of objects in 2D environment 300. The engine for virtual visualization of 3D models of objects in 2D environment 300 may include a receiving module 206, an importing module 208, a visualizing module 210, an adding scale and perspective module 211, a superimposing module 212, an object color/object material replacing module 214, a moving module 216, a modify object module 217, a spinning module 218, a saving module 224, an uploading module 226 and a purchasing module 228.

Although various modules of the engine for visualization of 3D models of objects in 2D environment 300 are shown together, the engine for visualization of 3D models of objects in 2D environment 300 may be implemented as a web service, via a distributed architecture, or within a cloud computing environment. The files created with this application may contain perspective, scale and 3D model information in addition to the 2D graphic background information. The files may be shared, or sent to, or opened on any user devices which may be configured to display these files.

The receiving module 206 may be configured to receive inputs from the user 120 regarding an import request. The import requests may include user-specified data regarding a 2D environment, such that the 2D environment may be used as a background environment for displaying one or more 3D models of objects. The importing module 208 may be configured to import the 2D environment. The 2D environment may be a 2D photograph of an interior space such as a living room, or a bedroom, or a kitchen space, or a bathroom, or a garage, or an office space, and so forth. Additionally, the 2D environment may be a live video feed.

The visualizing module 210 may help the user 120 to visualize the imported 2D environment. The visualizing module 210 may be configured to receive a superimposing request from the user 120. The superimposing request may include object information data related to a 3D object.

The received superimposing request is passed to the superimposing module 212, which superimposes the selected 3D object, based on the superimposing request onto the 2D environment.

An example 3D object may be a display. The display may be any of a liquid crystal display (LCD), light emitting diode (LED), organic light emitting diode (OLED), cathode based display, or any other display capable of providing a visual image to a viewer. The display may be comprise any of a plurality of shapes, such as square, rectangular, curved, round, or any suitable geometric shape. Further, the display may include a support frame, may be frameless, or any other structural form factor known in the art. The display may be a stand-alone display or a unit of a composite display including multiple display units.

In addition, the visualizing module 210 may be further configured to receive a request for object replacement from the user. The object replacement request may include object information data or metadata encoding object information data including dimensions, or color, or material type of the 3D object selected from the library of 3D objects. The received object replacement request is passed to the object replacing module 214, which changes the object, based on the request. Additionally, the selected 3D object may be replaced by the user 120 with another 3D object. For example, the user may replace a large chair with a small chair in a 2D environment after visualizing both the large chair and the small chair in the 2D environment.

The visualizing module 210 may further help the user 120 to alter view settings such as brightness or contrast of the imported 2D environment. Altering the brightness or contrast of the 2D environment may allow the user to visualize the positioning of the 3D object in the 2D environment under more light or less light situations. For example, the user may be able to visualize and appreciate how the 3D object superimposed on the 2D environment may look during day time versus night time conditions, or conditions of bright lighting or dim lighting where a lamp or light fixture is being used. Additionally, the visualizing module 210 may also help the user with directional options, such as a compass or a north facing arrow to identify the orientation of the 2D environment. The user may prefer directional options for personal reasons, or aesthetic preference, or for daylight requirement needs. The visualizing module 210 may be further configured to receive scale data (defining the scale of the 2D environment) and the perspective data (defining the perspective of the 2D environment) request from the user. The scale data and perspective data request is passed on to the adding scale and perspective module 211, which allows the user to adjust the scale and perspective of the 2D environment.

In some examples, a smart object, such as a television or computer (described in more detail below in regards to FIG. 7), may be superimposed in the two-dimensional environment. The visualizing module may be adapted for playback animation of the smart object based on a location position in the two-dimensional environment. For example, the visualizing module may display animation of the smart object as it would appear in the location within a room. The animation may be any audio or visual display, including but not limited to live video (adjusted based on position), or schematic representation of audio or visual display in a room.

The method then moves on to the moving module 216. The moving module 216 may be configured to receive an object spinning request for rotational movement of the 3D object imported on to the 2D environment. The spinning request thus received is passed on to the spinning module 218, which allows spinning or any such rotational movement of the 3D object in the 2D environment. For example, the 3D object inserted onto the 2D environment might be a chair or triangular table, and the user may prefer to precisely orient the chair seat in a particular direction or in case of the triangular table, the user may prefer to the three corners of the table oriented in a certain preferred directions.

The user may also modify one or more properties of the 3D object by changing the color, material, and/or dimensions of the 3D object. The modify object module 217 may be configured to receive a request to change one or more properties of the 3D object. For example, the modify object module 217 may receive the request to change the color of the framing of display to match a color of a wall within the two-dimensional environment. Upon receipt of the request, the modify object module 217 may change the color of the display framing to match the wall of the two-dimensional environment.

In addition to modifying physical properties of the 3D object, the modify object module 217 may be configured to change the behavior characteristics of the 3D object within the 2D environment. For example, a 3D object such as a chair may include behavior characteristics constraining the chair to positions on the floor of the 3D environment. Other 3D objects such as a lamp, may be constrained to positions on the floor, on a desk, a wall ledge, etc. Additional behavior characteristics may include a minimum clearance space around the 3D object, mounting requirements for the 3D object, length of a power cord/power requirements, or any other suitable characteristic or constraint that may affect the positioning of the 3D model within a two-dimensional environment. In some embodiments, the modify object module 217 may be configured to provide a visualization displayed by the 3D object. The user may save the changes made to the 3D object to a local library of 3D objects or the changes may be saved to remotely stored 3D object library.

As the user finalizes the appropriate color, material, positioning and spinning of the selected 3D object within the 2D environment, the resulting image may be uploaded to a social network website, microblogging service, blog or any other website resources by the uploading module 226. Thereby, the user 120 may receive inputs from contacts such as family members or friends regarding the resulting image formed by the 3D object placement in the 2D environment. With appropriate inputs, the user 120 may choose to alter the resulting image of the 3D object in the 2D environment. In addition, based on user request, the saving module 224 may save the resulting image for future use or reference. Alternatively, the user 120 may be highly satisfied with the overall look of the 3D object in the 2D environment and decide to purchase the 3D object. In such a situation the purchasing request is passed to the purchasing module, 228. In some embodiments, a contact of the user 120 via social networking websites in the web application 204, may request the user to purchase the 3D object in consideration.

Turning now to FIGS. 3A, 3B and 3C. FIG. 3A illustrates an example 2D environment 300. The example 2D environment 300 may include an interior space bounded by a wall 304, a wall 306 and a ground plane 302 (e.g. a flooring surface). The example 2D environment may comprise various objects such as a wall mirror 340, a table 334 and a display 324. Of these objects, the wall mirror 340 may be part of the 2D environment 300, while the table 334 and the display 324 may be 3D models of objects superimposed on the 2D environment. The user may move the table 334 and the display 324 as desired but may not be able to move the wall mirror 340 since it is part of the 2D environment.

FIG. 3A further includes a library 320. The library 320 may include various 3D objects that may be imported onto the 2D environment 300. As shown in FIGS. 3A-C, the library includes a couch 322, a table 330, a step stool 326, a table 334, a small drawer 328, a chest of drawers 336 and the display 324. The library 320 may include but not restricted to the items illustrated. Additionally, when the 3D object is selected, a menu bar may be displayed indicating if the object selected is a floor object, a wall object or a ceiling object. A finger icon 394 or other suitable indicator may be used to select a 3D object from the library 320 and superimpose the 3D object onto the 2D environment 300. Alternatively, the user may use key board, or touch pad, or mouse key on one of the user devices 130, to select and drag 3D objects onto the 2D environment 300. As illustrated in FIG. 3A, the display 324 adorns the wall 306 of the 2D environment 300 and the wall mirror 340 adorns a wall 304 of 2D environment 300. The display is a 3D model superimposed on the 2D environment 300, while the wall mirror 340 is part of the 2D environment.

The table 334 is placed on the floor 302 of the 2D environment 300. The 3D models, such as the display 324 and the table 334, may be further moved up or down or sideways or rotated along an axis or along multiple axes and adjusted in the 2D environment 300 of the room. Further the items may be positioned one on top of the other. For example, the user may consider purchasing a vase for the 2D environment 300. In such cases, the user may select additional 3D objects, in this example, the vase, and position the vase in a way that is practically and aesthetically satisfactory. If the user is not satisfied with the placement of the vase, the user has the option of deselecting or undoing his selection of the vase.

The user may decide to replace the table 334 in the 2D environment 300 with the table 330 in the library 320. As shown in FIG. 3A, the finger icon 350 or other suitable indicator may be used to select the table 334 as the 3D object which may be replaced. As shown in FIG. 3B, dashed line finger icon 313 shows selection of the table after the finger moves away. Specifically, a highlight indicator or other suitable indicator may be used to identify a selection. For example, the table 334 may glow as indicated at 311 when or after selection. Such an indicator may enable a user to clearly see what object is being replaced or altered.

Further, shown in FIG. 3B, the solid line finger icon or other suitable indicator may then select the table 330 in the library 320 as the 3D object to replace the table 334 in the 2D environment 300. As illustrated in FIG. 3B, the dashed arrow indicates the movement of the finger icon 394 or other suitable indicator to superimpose the selected 3D object, the table 330, to the current position of the table 334. FIG. 3C illustrates the final image with the table 334 replaced by the table 330 in the 2D environment 300.

Additionally, the table 334 may be replaced by any other floor object such as the step stool 326 or the chest of drawers 336 or the small drawer 328, selected from the library 320. Further, the user may download additional 3D object images from the network 202. Still further, a contact of the user, such as a family member or friend may share a 3D object image with the user via social networking websites as discussed for web applications 204. The user may download the image of the 3D object and save the image in the library 320 for immediate or future applications.

Similar to replacing floor objects, the user may decide to move or replace a wall object, such as the display 324 on the wall 304. The user may do so by selecting the display 324 with the finger icon 394 or other suitable indicator and then move the 3D object in a horizontal, or vertical or a combination of horizontal and vertical directions. If new position of the display 324 is not satisfactory to the user, the user may decide to replace the display 324. For example, the user may decide to replace the display with a second display. The 3D model of the second display may be included in the library 320, or the user may download an image of the second display from a website or a blog or one of the social network services, or the user may obtain an image of the second display with one of the user devices and import the image into the library 320.

In further examples, the user may replace 3D objects in a top plane, such as a ceiling plane. In such examples, the user may desire to replace existing light fixtures with more aesthetically pleasing or practically necessary light fixtures. Further, the user may decide to replace a top plane object such as a ceiling fan with a light fixture for practical or aesthetic requirements.

FIG. 4 illustrates an example flow chart of a method 400 for positioning and aligning 3D objects in 2D environment. The method 400 may be performed by processing logic that may comprise hardware (e.g., programmable logic, microcode, and so forth), software (such as computer code executable on a general-purpose computer system or a specifically configured computer system), or a combination of both. The processing logic resides at the engine 200 for virtual visualization of 3D models of objects in 2D environment, as illustrated in FIG. 2. The method 400 may be performed by the various modules discussed above with reference to FIG. 2. Each of these modules may comprise processing logic.

Method 400 begins at 404 where the user 120 may obtain a 2D environment according to an import request. The receiving module 206 may receive, from the user, scale and perspective data on ground plane at operation 406. Similarly, the receiving module 206 may receive, from the user, scale and perspective data on ceiling height at operation 408. The user may define the ceiling and ground plane by selecting points on the 2D environment and at operation 409, method 400 may include determining wall corners based upon the selected points.

Method 400 continues to operation 410, for positioning 3D models of objects. At operation 410, the receiving module 206 may receive a request to superimpose 3D models of objects onto the 2D environment. A superimposing request may include a user selecting a 3D object from a library of 3D models of objects (in the engine for virtual visualization of 3D models of objects in 2D environment 300), from 3D models of objects saved or imported by the user, or 3D models of objects obtained from online resources. At operation 412, the 3D models of objects may be superimposed onto the 2D environment.

At operation 414, if the user may decide to superimpose additional 3D objects in 2D environment the method 400 moves to operation 420. If the user decides to continue without adding more 3D objects to the 2D environment, the method 400 moves to operation 432. Method 400 may include operations to replace objects 430 within the 2D environment. At operation 432, the user may decide to replace an existing object in the 2D environment. If the user continues with replacing 3D object in the 2D environment, then at operation 434, the 3D object to be replaced is selected by the user. In some embodiments, the object may be highlighted or otherwise indicated as the to-be-replaced object. The method 400 then moves to operation 436 and at operation 436, the user may select a new 3D object from the library, such as the library 320 discussed in FIG. 3A. As method 400 moves to operation 438, the new 3D object may be superimposed in the 2D environment to replace the previous 3D object present in the 2D environment. The insertion of the new object to replace the prior object may be an automatic replacement which occurs after selection of the object from the library.

If the user decides to move or rotate the 3D object in the 2D environment as opposed to replacing the object, then the method 400 moves to operation 422. At operation 422, if the user may move the selected 3D object in a horizontal manner along an x-axis or in a vertical manner along a y-axis, or a combination of both horizontal and vertical manner, or rotational manner. At operation 424, after moving and rotating the 3D object, the user be further desire to replace the 3D object. The method then returns to operation 432.

FIG. 5 illustrates four images, image A, image B, image C and image D. All the four images represent a 2D environment 500. The 2D environment 500 includes a ground plane 506, a top plane 508, a wall plane 512 and a wall plane 514. Between image A and image B, one of the images has scale and perspective added and the other does not. As shown in FIG. 5, image B is configured to include an indicator icon 520 at the top right corner. The indicator icon 520 helps the user identify image B as the image to which scale and perspective has been added. The visualizing module may be configured to determine the presence of scale data and perspective data added to the two-dimensional image.

The indicator icon 520 in image B of FIG. 5 is in the shape of a diamond. In other embodiments, the indicator icon 520 may be represented by another shape such as a circle or a square or an oval. In further embodiments, the indicator icon 520 may include a letter or a number or a logo. Still further, in some embodiments, the icon 520 may be a watermark. The watermarking of a digital image may include a digital signature, a user identifier such as user initials, or similar value that can sufficiently identify the image from other similar images. Such watermarking may allow the user to quickly identify images to which data (scale and perspective) has been added.

The 2D environment 500 in image C may include an object such as a couch 516. Similarly, the 2D environment 500 in image D may also include a couch 518. The couch 516 in image C, may be part of the 2D environment 500, while the couch 518 in image D, may be 3D model of an object superimposed onto the 2D environment 500. As shown in FIG. 5, image D may include an icon 522, identifying image D as the image to which scale and perspective, and a 3D model of an object, such as the couch 518, has been added. The icon 522, as shown in image D is in the shape of a diamond including a dashed line. As described above for the indicator icon 520, the icon 522 may configured to be of different shapes and sizes, may include a letter or a pattern such as the dashed line in this example, may include a shaded region, and such others. In some embodiments, the icon 522 may include a digital signature or a watermark or a logo and such other identification so that the user may be able to distinguish between an image of the 2D environment from the image of a 2D environment where scale and perspective and 3D models of objects have been added.

Further, FIG. 5 illustrates the indicator icon 520 and the icon 522 at the top right corner. In other embodiments, the icon may be located at other locations within the image such as a top left corner, a bottom right corner, and a bottom left corner, or along one of the four sides of the image. In still further embodiments, the icon may include a watermark running across the length of the image in a vertical manner, or a horizontal manner, or a diagonal manner.

Moving now to FIGS. 6A, 6B, 6C, 6D and 6E illustrate another example of a 2D environment, 600. In this example the 2D environment 600, may include any digital image such as a photograph or live camera feed, captured by the user or downloaded from a library coupled to the engine for visualization of 3D models of objects in 2D environment 600, online resources such as networking websites, and so forth.

Figure 6A:
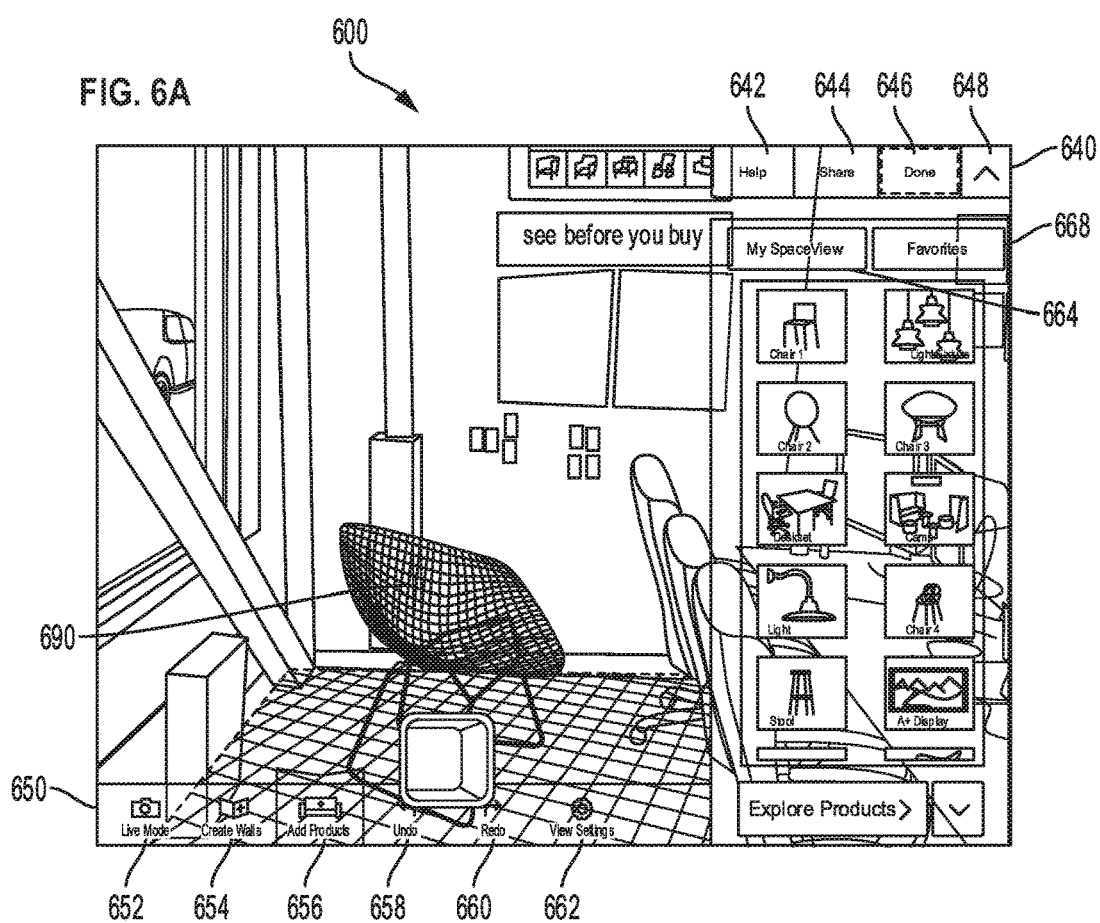
FIGS. 6A, 6B, 6C, 6D and 6E are example representations of another 2D environment.

Further, FIG. 6A may include a menu bar 650 on the display screen. The menu bar 650 may aid the user to access various functions for customizing the 2D environment. In the example menu bar 650 shown in FIG. 6A, there is a first virtual button 652, a second virtual button 654, a third virtual button 656, a fourth virtual button 658, a fifth virtual button 660 and a sixth virtual button 662 presented along the menu bar 650. The first virtual button 652, which is labeled "Live Mode," may be selected by the user 120 to visualize a 2D environment with any of the user devices 130, discussed above. The "Live Mode" button allows the user 120 to switch between edit mode (where objects may be moved, edited and so forth) and a "live" mode where the end result is displayed.

The second virtual button 654, which is labeled "Create Walls," may be selected by the user 120 to form walls within the 2D environment. The third virtual button 656, which is labeled "Add Products," may be selected by the user 120 to add 3D objects to the 2D environment 600. These 3D objects may be obtained by the user 120 from the network 202 or from the web applications, such as social networking services, 204. In one example, the user may select one or more 3D objects from a catalog of 3D objects from multiple vendors and 3D object sources to display in the 2D environment.

The user may access the library by clicking on or selecting the Add Products button, third virtual button 656, on the menu bar 650. The user may use one or more of the input devices of user devices 130 to access the Add Products button, third virtual button 656. The additionally selected 3D object may then be superimposed on the 2D environment 600.

The fourth virtual button 658 labeled "Undo," may be selected by the user 120 to undo a prior modification of the selected 3D objects, or a most recent selection of the 3D object. For example, if the user 120 is not satisfied with the positioning of the 3D object, the user may undo the addition or superimposing of the 3D object onto the 2D environment 600. The fifth virtual button 660, which is labeled "Redo," may be selected by the user 120 to redo a movement of the 3D object that was recently performed. For example, the user 120 may decide to move a 3D object superimposed on the 2D environment horizontally. The user may further decide to move the 3D object, in which case the user may select the fifth virtual button 660 to "Redo" the horizontal move to repeat the previous move.

The sixth virtual button 662, which is labeled "View Settings," may be selected by the user 120 to review the settings of the 2D environment, in this example, 2D environment 600. For instance, the user 120 may not be satisfied with the brightness of the 2D environment 600 and hence would prefer to adjust the brightness, or the user 120 may not be satisfied with the color contrast of the room and would prefer to adjust the contrast settings. Additionally, the View Settings button, sixth virtual button 662, may provide the option of direction via a compass or a north pointing directional arrow. This may aid the user 120 in placing 3D objects in a particular preferred direction. Several users may have directional preference for placing of objects with respect to object material type and color and the directional aspect is hence very useful for such purposes.

FIGS. 6A-6D also includes a virtual icon button 664 for "My SpaceView" and a virtual icon button 668 for "Favorites". With the aid of the virtual icon button 668 for "Favorites", the user may save favorite 3D models of objects for later use. For example, the user may position a chair near a dining table and may be highly satisfied with the placement. At this point, the user may decide to save the chair under "Favorites" for later use. At a later time, the user may decide to add more such chairs around the dining table. The user may do so by selecting the virtual icon button 668 for "Favorites" and quickly access the chair of choice.

Figure 6B:
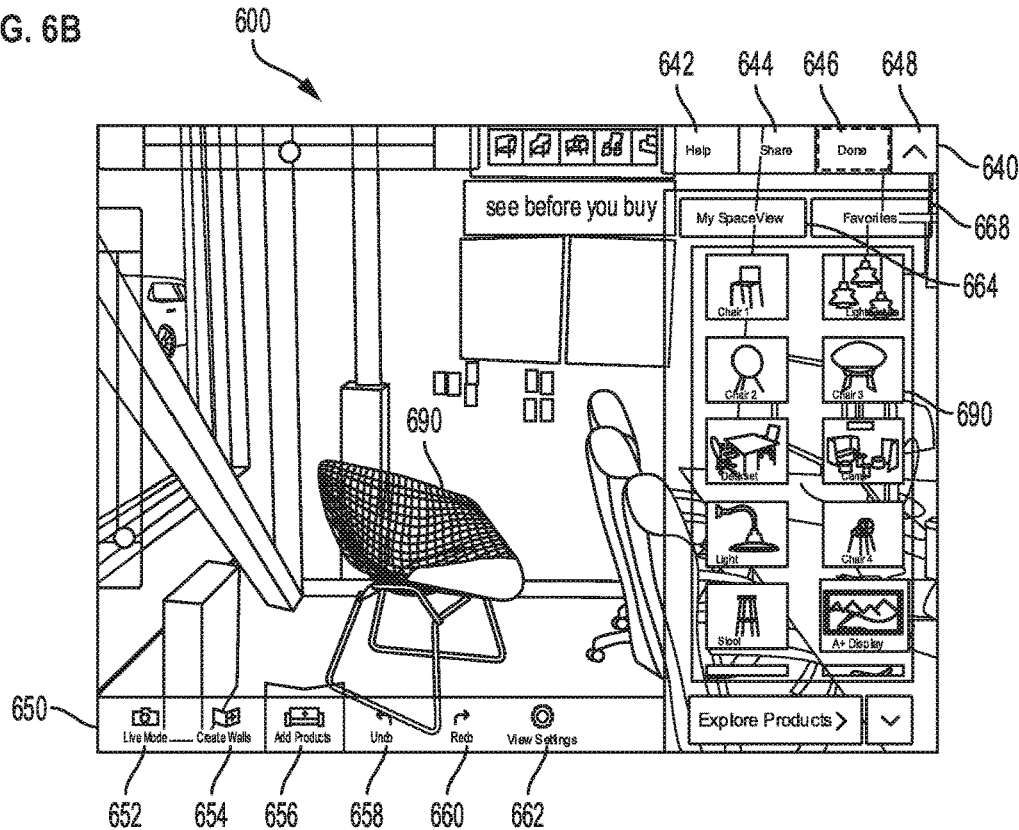
Figure 6C:
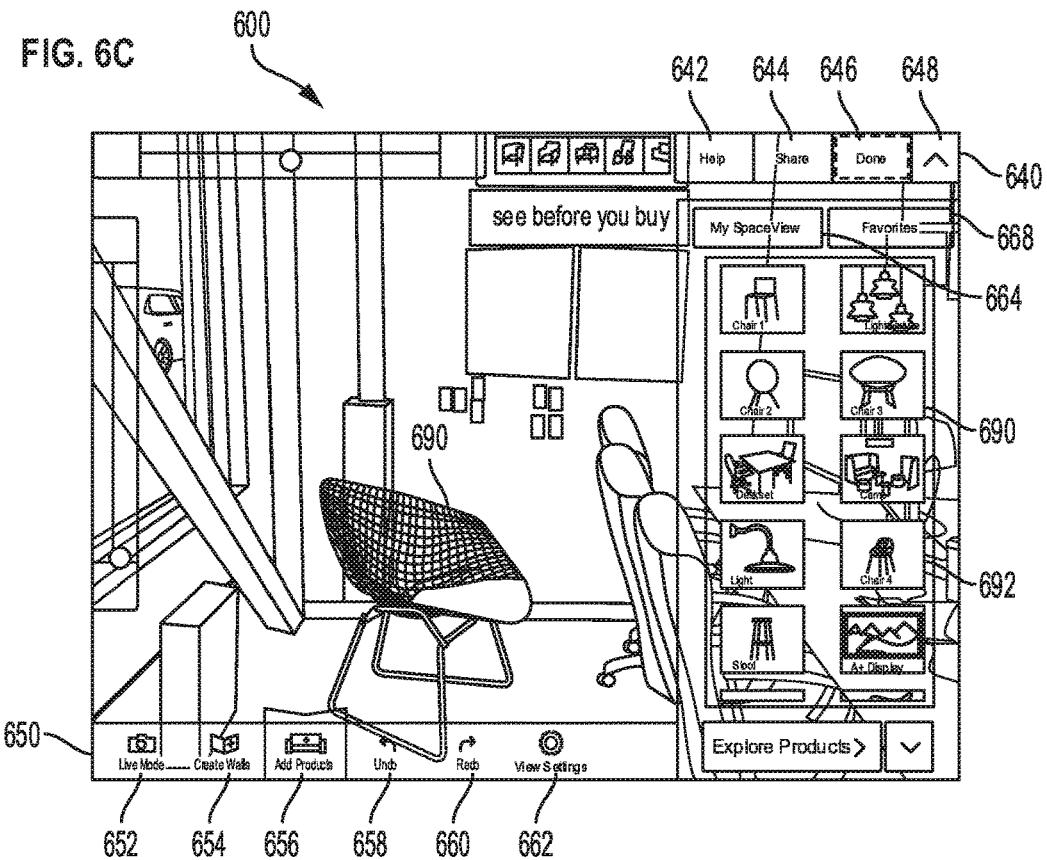

In the example demonstrated in FIGS. 6A-6C, a chair 690 has been selected and superimposed onto the environment 600. In FIG. 6A, the lighter shade of the chair 690 indicates that the user is still in the process of positioning the chair 690. While being positioned by the user, the 3D model of the object may look transparent or faint or light in color. Further, in some examples, the floor or relevant plane may be indicated as a placement plane through highlighting or other indicator. In FIG. 6B, the user successfully positioned the chair 690 in the environment 600.

In FIG. 6C, the user may decide to select the chair 690 to be replaced. The darker shade and the outer boundary color for the chair 690 corresponds to the user's selection for replacement. Selection of the 3D model of the object may include a different boundary color, or a darker shade for the 3D model selected. In some embodiments selection of the 3D model may include a glow, or increased radiance, or increased brightness around the 3D model of the object. In further embodiments, the selected 3D objects may be surrounded or encircled by a shaded area. The shaded area may be the same color as the 3D model of the object selected or of a different color.

Figure 6D:
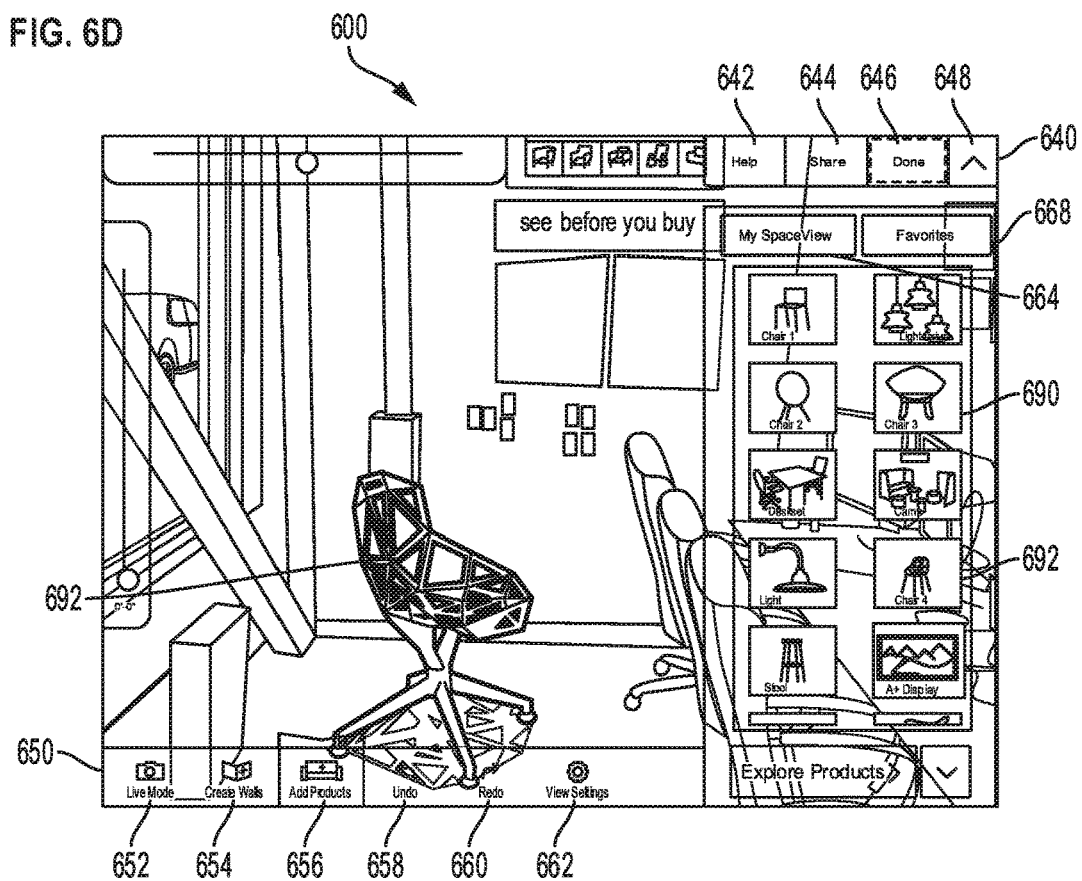

Moving to FIG. 6D, the chair 690 is shown to be removed from the 2D environment and replaced with a chair 692. The dark shade and outer boundary color of the chair 692 corresponds to the user's selection of the chair 692. In the example illustrated, the chair 690 in FIG. 6C and the chair 692 in FIG. 6D include a red shaded area corresponding to the user's selection of the chair 690 to be replaced with the chair 692.

Figure 6E:
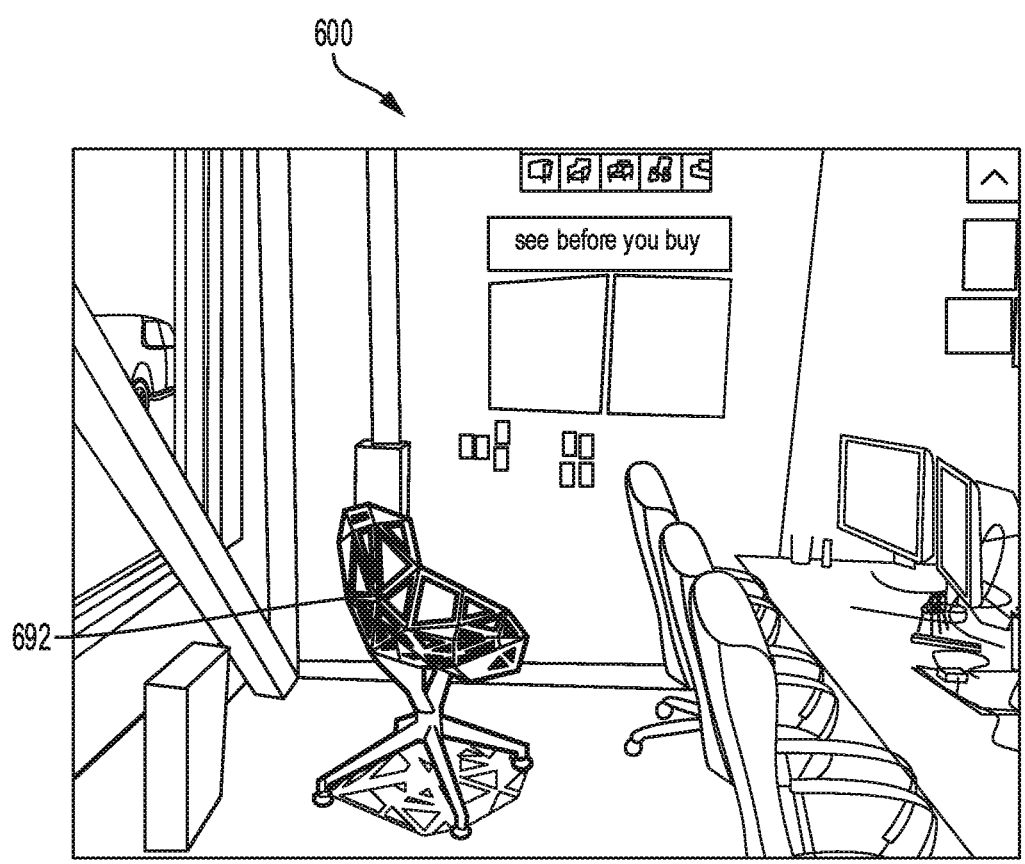

Furthermore, the user 120 may save and share screenshots of the 3D object positioned in the 2D environment 600. The user may further have access to another menu bar 640. The menu bar 640 may be displayed by clicking on a virtual icon arrow 648, displayed at the top right corner in FIG. 6A. The menu bar 640 provides the user with the option to obtain help with a "Help" virtual icon button 642, or share the current image with a "Share" virtual icon button 644. The user may decide to obtain help or input from contacts in social networking groups in the web application 204 by sharing images of the 2D environment 600 with the superimposed 3D object. Further, the user may be satisfied with the placement of the 3D object in the 2D environment and may then select a virtual icon button 646 to indicate "Done" or completion. As illustrated in FIG. 6E, the user selection of the chair 692 has been completed and finalized for the room environment 600.

Figure 7A:
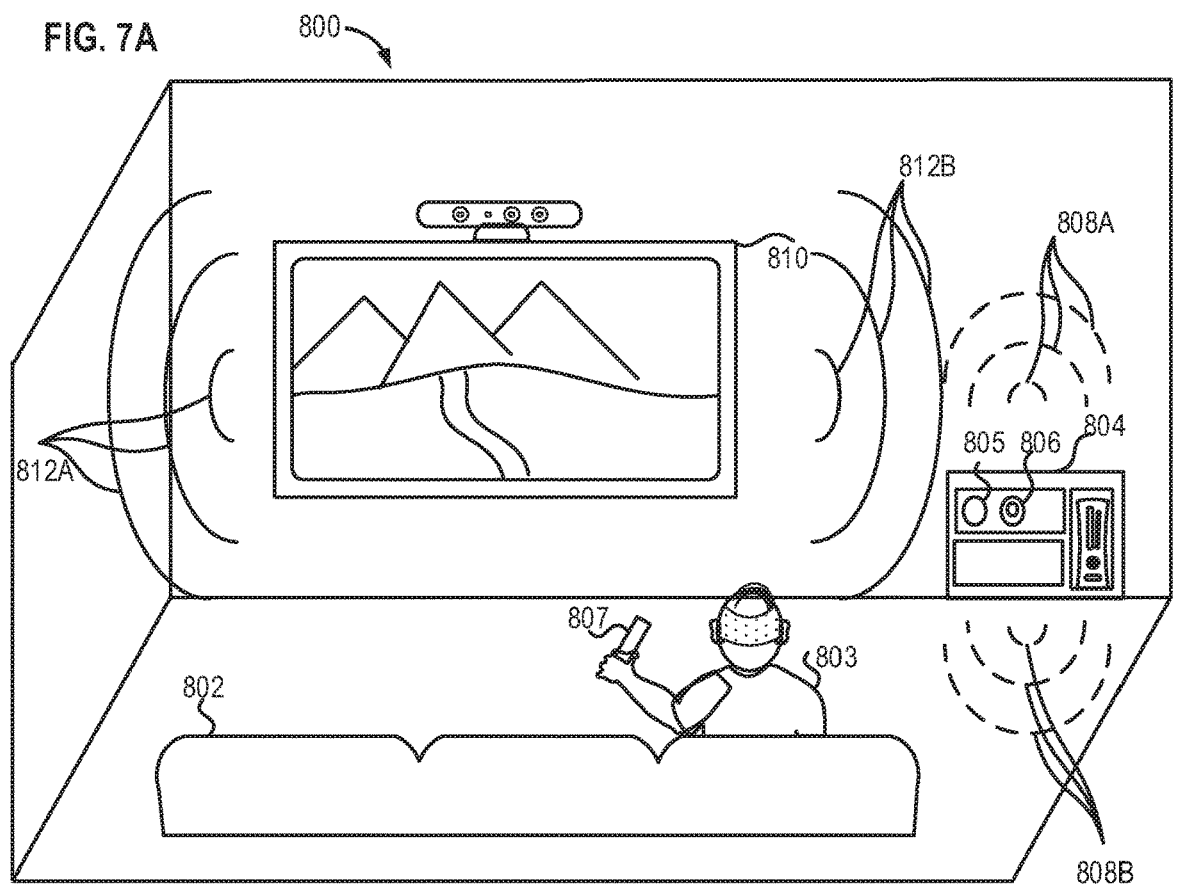
Figure 8:
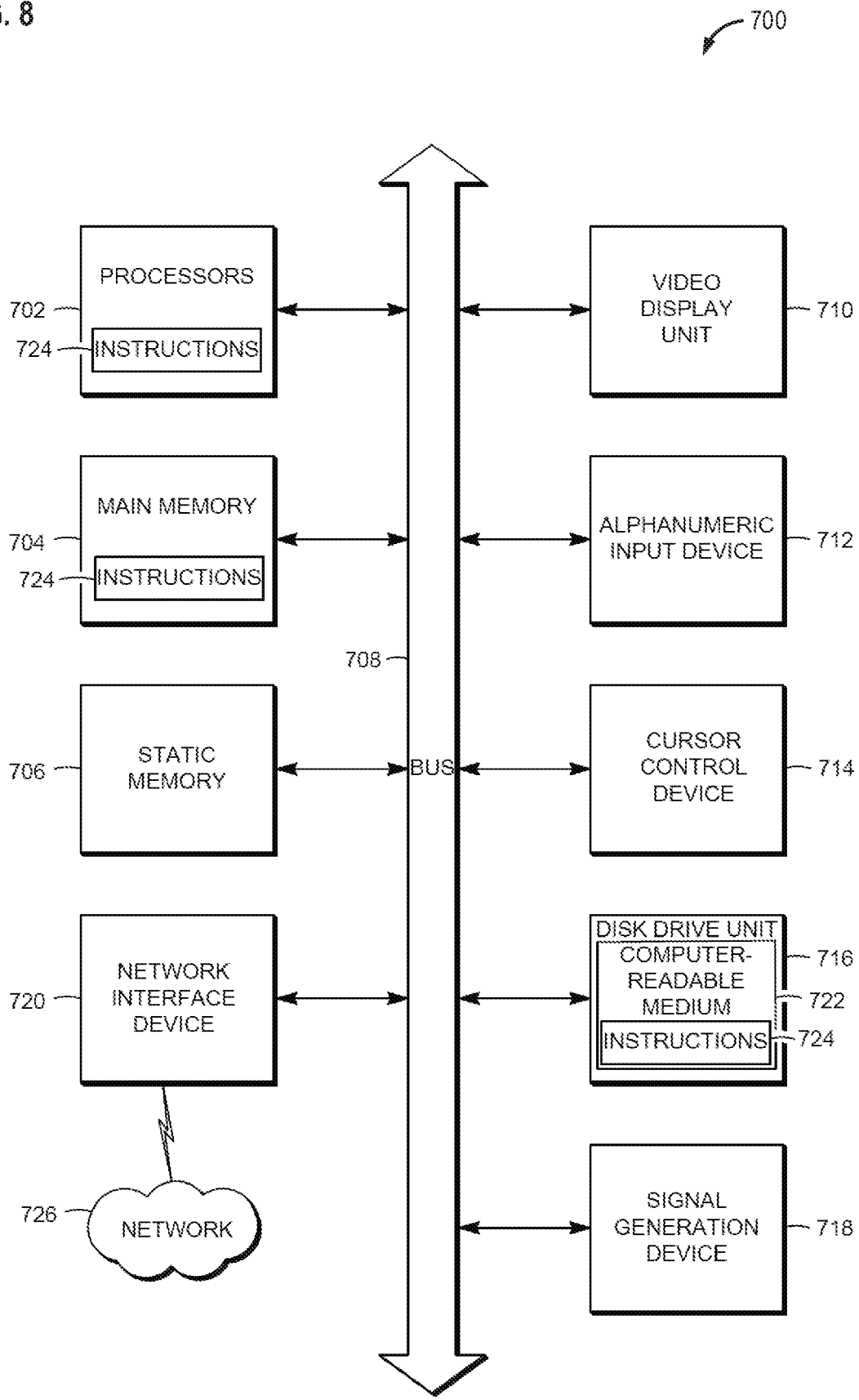
FIG. 8 illustrates an example of a computer network system, in which various embodiments may be implemented.

FIG. 7A illustrates a 2D environment 800. The environment 800 may include a couch 802, a viewer 803, one or more smart objects, (e.g. A first smart object 811, a first smart object controller 807, a second smart object 804, a first knob 805 and a second knob 806 on the second smart object 804). The environment 800 may further include a first set of sound waves 812A and a second set of sound waves 812B from the first smart object 810. Similarly, the environment 800 may also include a first set of waveform 808A and a second set of waveform 808B emanating from the second smart object 804.

In some examples, one or more objects may be part of the 2D environment, such as couch 802. In other examples, the objects may be selective positioned in the room as replaceable 3D object.

Smart objects may be any device with playback animation. The playback animation may be live playback, such as video playback or may, in some examples, be representative playback. For example, the playback animation may be audio or visual display, such as video, or an audio or visual schematic representation. Examples of video playback smart objects may be a television, a computer, a stereo screen, a control panel, etc. Audio playback smart objects may include speakers, radios, noise cancelling devices, etc. Environment playback smart objects may be lighting devices, security devices, climate control devices, etc.

In the example illustrated in FIG. 7A, a first smart object 810 is illustrated as a television (TV) screen and the second smart object 804 is illustrated as a stereo system. In other examples, the first smart object or the second smart object may include other objects which may be a source of audio transmission and visual display, such as a smart phone, or a tablet PC. Further examples may include other technology devices that may provide audio-visual information, internet or media information and so forth.

As illustrated, the television may be adjusted to the selected wall plane as indicated schematically at first smart object 810. A user may adjust a position of an object, such as display 810, onto another wall surface, such as illustrated in FIGS. 7B and 7C.

Figure 7B:
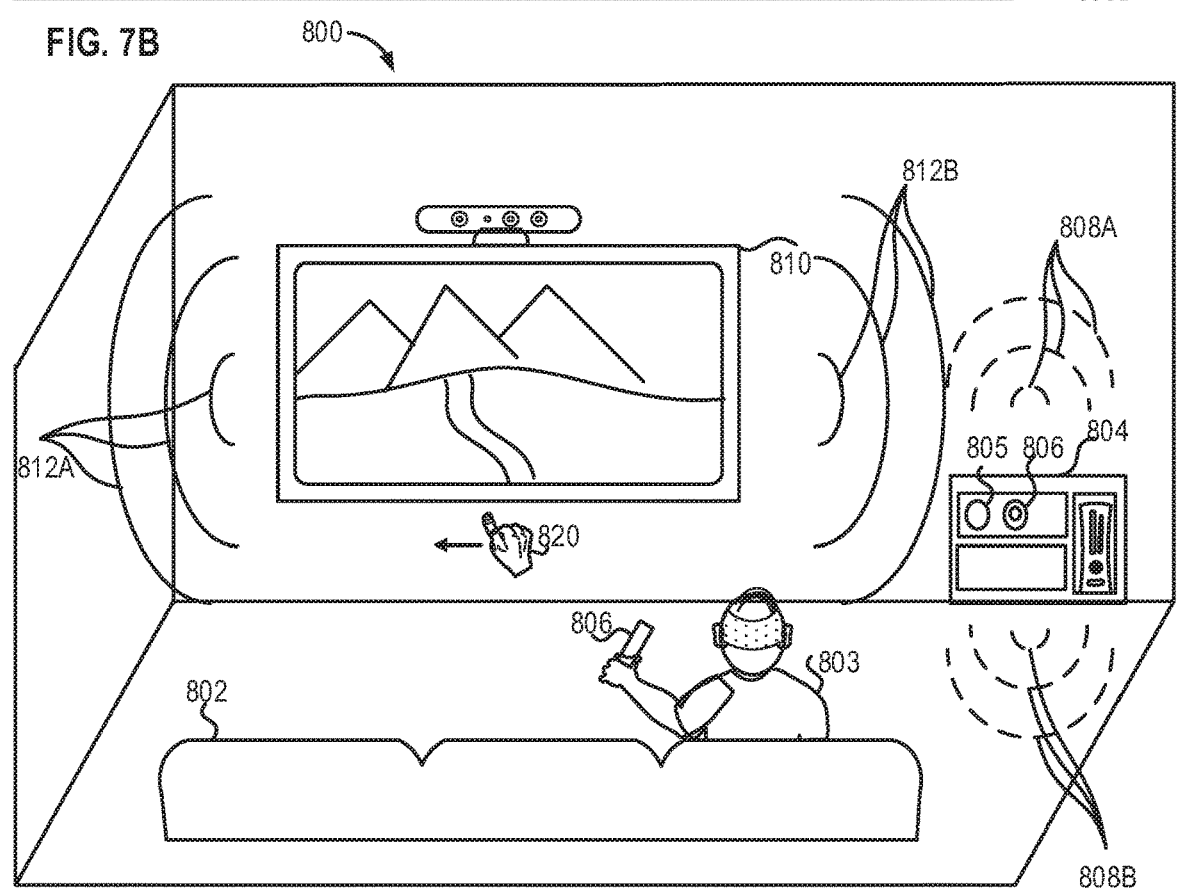

FIG. 7B illustrates a user requesting a move of first smart object 810. The user may request movement of smart object 810 using finger icon 820 or other suitable indicator. The user may drag first smart object 810 in the direction of the arrow to another wall surface.

FIG. 7C illustrates the changing of the perspective and scale of first smart object 810 to match the perspective and scale of the other wall surface. Further, the video or other playback animation may be displayed to match the perspective and scale of the wall surface as illustrated. In this example, the perspective of first smart object 810 is based a change in the viewing angle of first smart object 810. In order to properly display both first smart object 810 and the video and playback animation in the proper perspective, the visualization module may adjust first smart object 810 and the video and/or playback animation display within to account for such optical factors as parallax, changes in the angle and quantity of incident light, and other optical effects that may affect viewing of the first smart object 810 and the video and/or playback animation due to the movement of first smart object 810 within 2D environment 800. In some embodiments, the visualization module may also include properties of the first smart object 810, such as the reflectivity of the materials of the first smart object, geometry of the first smart object, the presence of anti-reflective coating over a screen surface, or any other property encoded in the metadata comprising the object information data.

In another embodiment, the visualization module may include acoustical effects based upon the change of location of first smart object 810 within 2D environment 800. In this specific example, the visualization module may determine the change in relationship between the point of view of the user and the location of first smart object 810. Based upon the change in relationship, the visualization module may provide the user with an audible signal, such as a test tone, audio clip, or other audibly registered signal, which may allow the user to audibly assess the change of position of first smart object 810 within 2D environment 800. In some embodiments, the visualization module may include the scale data and perspective data of the 2D environment 800 to adjust the audible signal for the acoustic properties of the 2D environment 800 as well as the change in location of the first smart object 810.

As discussed above, video or other playback animation may be displayed in accordance with a room position. Similarly, schematic representation of audio or visual output may be shown based on location. As an illustrative example, FIG. 7A illustrates the first set of sound waves 812A and the second set of sound waves 812B radiating from the smart object 810. This illustration of sound waves may allow the user to visualize the extent to which the sound transmission from the smart object 810 may be heard. Such sound wave illustration may allow the user to superimpose additional 3D models of object onto the 2D environment. For example, if the user prefers to add a second couch to the 2D environment 800, the user may use the sound waves as a guide to position the second couch, so that a viewer on the second couch may enjoy the audio transmission from the first smart object 810.

Moving now to the second smart object 804. In the example illustrated, the second smart object 804 may be a stereo system which may include the first knob 805, which may be configured to control the sound volume and the second knob 806 may be configured to control the bass of the sound emanating from the stereo. In other embodiments, the first knob 805 and the second knob may be configured to control sound frequency or sound amplification or such other sound control features. As discussed above for the first smart object 810, the second smart object 804 may include the first set of waveform 808A and the second set of waveform 808B, representing the extent of sound waves emanating from the second smart object 804. The extent of the first set of waveform 808A and the second set of waveform 808B, may allow the user to understand the extent to which the sound emanating from the second smart object may be heard. This may allow the user in superimposing additional 3D model such as a couch or a chair or a recliner onto the 2D environment 800, such that a listener, listening to the sound from the second smart object 804 may be positioned appropriately.

FIG. 8 shows an example electronic form of a computer system 700, within which a set of instructions for causing a machine to perform any one or more of the methodologies discussed herein may be executed. The machine may be a PC, a tablet PC, a set-top box (STB), a PDA, a cellular telephone, a web appliance, a network router, switch or bridge, or any machine capable of executing a set of instructions (sequential or otherwise) that specify actions to be taken by that machine. In several example embodiments, the machine operates as a standalone device or may be connected to other machines (e.g., networked). In a networked disposition, the machine may operate in the capacity of a server or a client machine in a server-client network environment.

The example computer system 700 may be configured to include a processor or multiple processors 702 (e.g., a central processing unit (CPU), a graphics processing unit (GPU), or both), a main memory 704 and a static memory 706, which communicate with each other via a bus 708. The computer system 700 may further include a video display unit 710 (e.g., a liquid crystal display (LCD) or a cathode ray tube (CRT), and the like). The computer system 700 may also include an alphanumeric input device 712 (e.g., a keyboard, and the like), a cursor control device 714 (e.g., a mouse, touchpad, touchscreen, and the like), a disk drive unit 716 for reading computer readable medium (e.g., USB thumb drive, solid state memory drives, and the like), a signal generation device 718 (e.g., a speaker, and the like (e.g., network interface card, and the like), and a network interface device 720.

Further, the disk drive unit 716 may include a computer-readable medium 722, on which is stored one or more sets of instructions and data structures (such as instructions 724) embodying or utilized by any one or more of the methodologies or functions described herein. Additionally, the instructions 724 may also reside, completely or partially, within the main memory 704 and/or within the processors 702 during execution by the computer system 700. The main memory 704 and the processors 702 may also constitute machine-readable media. Further still, the instructions 724 may be transmitted or received over a network 726 via the network interface device 720 utilizing any one of a number of well-known transfer protocols (e.g., Hyper Text Transfer Protocol (HTTP)).

The computer-readable medium 722 may include a single medium or multiple media (e.g., a centralized or distributed database and/or associated caches and servers) that store the one or more sets of instructions. The term "computer-readable medium" may further include any medium that is capable of storing, encoding, or carrying a set of instructions for execution by the machine and that causes the machine to perform any one or more of the methodologies of the present application, or that is capable of storing, encoding, or carrying data structures utilized by or associated with such a set of instructions. Further, "computer-readable medium" may further include, but not be limited to, solid-state memories, optical and magnetic media, and carrier wave signals. Such media may also include, without limitation, hard disks, floppy disks, flash memory cards, digital video disks, random access memory (RAM), read only memory (ROM), and the like.

It will be appreciated that the configurations and routines disclosed herein are exemplary in nature, and that these specific embodiments are not to be considered in a limiting sense, because numerous variations are possible. For example, the above technology can be applied to various 3D objects superimposed on various 2D environments. The subject matter of the present disclosure includes all novel and non-obvious combinations and sub-combinations of the various systems and configurations, and other features, functions, and/or properties disclosed herein.

The above-disclosed embodiments may be combined with one or more of the embodiments and disclosures in U.S. Provisional Patent Application No. 61/992,629 entitled "METHOD FOR PROVIDING SCALE TO ALIGN 3D OBJECTS IN 2D ENVIRONMENT" filed May 13, 2014, one or more of the embodiments and disclosures in U.S. Provisional Patent Application No. 61/992,759 entitled "METHOD FOR FORMING WALLS TO ALIGN 3D OBJECTS IN 2D ENVIRONMENT", filed on May 13, 2014, one or more of the embodiments and disclosures in U.S. Provisional Patent Application No. 61/992,719 entitled "METHOD FOR PROVIDING A PROJECTION TO ALIGN 3D OBJECTS IN 2D ENVIRONMENT", filed May 13, 2014, one or more of the embodiments and disclosures in U.S. Provisional Patent Application No. 61/992,774 entitled "METHOD FOR MOVING AND ALIGNING 3D OBJECTS IN A PLANE WITHIN THE 2D ENVIRONMENT", filed May 13, 2014, and/or one or more of the embodiments and disclosures in U.S. Provisional Patent Application 61/992,665 entitled "METHOD FOR INTERACTIVE CATALOG FOR 3D OBJECTS WITHIN THE 2D ENVIRONMENT", filed May 13, 2014. The entire contents of each provisional application referenced herein are hereby incorporated by reference for all purposes. For example, and not as a limitation, the embodiments herein may be combined with the elements and features disclosed in Provisional Application No. 61/992,629, the embodiments herein may be combined with the elements and features disclosed in Provisional Application No. 61/992,759, in combination with one or more of the elements and features disclosed in Provisional Application No. 61/992,719, in combination with one or more of the elements and features disclosed in Provisional Application No. 61/992,774, and/or in combination with one or more of the elements and features disclosed in Provisional Application 61/992,665. These combinations may include one or more features disclosed in one or more of the referenced provisional applications, including combinations of embodiments disclosed herein with features shown in one, two, three, four, or five of the provisional applications.

Further, the entire contents of each concurrently filed application, U.S. Non-Provisional patent application Ser. No. 14/710,554 entitled "METHOD FOR PROVIDING SCALE TO ALIGN 3D OBJECTS IN 2D ENVIRONMENT" filed May 12, 2015, U.S. Non-Provisional patent application Ser. No. 14/710,557 entitled "METHOD FOR FORMING WALLS TO ALIGN 3D OBJECTS IN 2D ENVIRONMENT", filed on May 12, 2015, U.S. Non-Provisional patent application Ser. No. 14/710,560 entitled "METHOD FOR PROVIDING A PROJECTION TO ALIGN 3D OBJECTS IN 2D ENVIRONMENT", filed May 12, 2015, U.S. Non-Provisional patent application Ser. No. 14/710,561 entitled "METHOD FOR MOVING AND ALIGNING 3D OBJECTS IN A PLANE WITHIN THE 2D ENVIRONMENT", filed May 12, 2015, and/or U.S. Non-Provisional patent application Ser. No. 14/710,569 entitled "METHOD FOR INTERACTIVE CATALOG FOR 3D OBJECTS WITHIN THE 2D ENVIRONMENT", filed May 12, 2015, are referenced herein are hereby incorporated by reference for all purposes.

The foregoing description is illustrative of particular embodiments of the invention, but is not meant to be a limitation upon the practice thereof.

The foregoing discussion should be understood as illustrative and should not be considered limiting in any sense. While the inventions have been particularly shown and described with references to preferred embodiments thereof, it will be understood by those skilled in the art that various changes in form and details may be made therein without departing from the spirit and scope of the inventions as defined by the claims.

The corresponding structures, materials, acts and equivalents of all means or steps plus function elements in the claims below are intended to include any structure, material or acts for performing the functions in combination with other claimed elements as specifically claimed.

Finally, it will be understood that the articles, systems, and methods described hereinabove are embodiments of this disclosure—non-limiting examples for which numerous variations and extensions are contemplated as well. Accordingly, this disclosure includes all novel and non-obvious combinations and sub-combinations of the articles, systems, and methods disclosed herein, as well as any and all equivalents thereof.

The invention claimed is:

1. A method for visualizing a three-dimensional model of an object in a two-dimensional environment, the method comprising:
   receiving, with a processor, from a user, a superimposing request to superimpose the three-dimensional model of the object onto the two-dimensional environment;
   superimposing, with the processor, the three-dimensional model of the object onto the two-dimensional environment based on the superimposing request with a scale and a perspective based on the two-dimensional environment, where the three-dimensional model of the object includes a playback animation;
   visualizing, via a video display unit communicatively coupled to the processor, a resulting image including the three-dimensional model of the object superimposed onto the two-dimensional environment, wherein the playback animation of the three-dimensional model of the object includes an audio display adjusted based on a position of the three-dimensional model of the object within the two-dimensional environment and based on acoustic properties of the two-dimensional environment, and wherein the playback animation of the three-dimensional model of the object is displayed with a scale and a perspective based on the scale and the perspective of the three-dimensional model of the object and a position of the three-dimensional model of the object within the two-dimensional environment; and
   adjusting, with the processor, a visual appearance of the three-dimensional model of the object when the three-dimensional model of the object is selected by the user for modification.

2. The method of claim 1, wherein adjusting the visual appearance of the three-dimensional model of the object when the three-dimensional model of the object is selected by the user for modification comprises increasing or decreasing a shading of the three-dimensional model of the object when the three-dimensional model of the object is selected by the user for one of positioning in the two-dimensional environment and replacing with another three-dimensional model.

3. The method of claim 1, wherein adjusting the visual appearance of the three-dimensional model of the object when the three-dimensional model of the object is selected by the user for modification comprises visualizing an outer boundary color on an outer boundary of the three-dimensional model of the object.

4. The method of claim 1, further comprising generating, with the processor, and providing, via a signal generation device communicatively coupled to the processor, an audible tone based on the position of the three-dimensional model of the object within the two-dimensional environment.

5. The method of claim 4, further comprising adjusting the audible tone based on the scale and the perspective of the two-dimensional environment.

6. The method of claim 4, further comprising:
   receiving, with the processor, from the user, an updated position of the three-dimensional model of the object within the two-dimensional environment;
   visualizing, with the processor, an updated resulting image including the three-dimensional model of the object superimposed onto the two-dimensional environment at the updated position; and
   adjusting, with the processor, the audible tone according to a change in relationship between a point of view of the user and the updated position of the three-dimensional model of the object.

7. The method of claim 4, further comprising adjusting, with the processor, the audible tone to account for acoustic properties of the two-dimensional environment.

8. The method of claim 1, further comprising visualizing, via the video display unit, a set of sound waves emanating from the three-dimensional model of the object based on the position of the three-dimensional model of the object within the two-dimensional environment.

9. The method of claim 1, further comprising visualizing, with the processor, an indicator on the two-dimensional environment, the indicator indicating that the scale and the perspective of the two-dimensional environment is added to the two-dimensional environment.

10. A system for visualization of a three-dimensional model of an object in a two-dimensional environment, the system comprising:
   a processor; and
   a storage device, the storage device containing instructions executable by the processor comprising:
      a receiving module configured to receive one or more requests from a user, the requests including one or more of an import request, a scale data request, a superimposing request, and a request to save a resulting image;
      an importing module configured to import, based on the import request of the user, the two-dimensional environment;
      a superimposing module configured to superimpose, based on the superimposing request, the three-dimensional model of the object onto the two-dimensional environment with a scale and a perspective based on the two-dimensional environment;
      a visualizing module configured to display playback animation of the three-dimensional model of the object, wherein the playback animation of the three-dimensional model of the object includes an audio display and a visual display of the object, wherein a scale and a perspective for the visual display of the playback animation is based on a position of the three-dimensional model of the object in the two-dimensional environment, the visualizing module further configured to adjust a visual appearance of the three-dimensional model of the object for the visual display when the three-dimensional model of the object is selected by the user for modification, and the visualizing module is further configured to adjust the audio display based on acoustic properties of the two-dimensional environment; and a saving module configured to save the resulting image, based on the request to save the resulting image, wherein the resulting image includes the three-dimensional model of the object superimposed onto the two-dimensional environment.

11. The system of claim 10, wherein the visualizing module is further configured to visualize an indicator on the two-dimensional environment indicating that the scale and the perspective of the two-dimensional environment is added to the two-dimensional environment.

12. The system of claim 10, wherein the visualizing module is configured to display the playback animation of the object on a surface of the three-dimensional model of the object.

13. The system of claim 10, wherein the visualizing module is configured to display the playback animation of the object away from the three-dimensional model of the object.

14. The system of claim 10, wherein the storage device further contains instructions executable by the processor comprising a moving module configured to move the position of the three-dimensional model of the object from a first position to a second position.

15. The system of claim 14, wherein the visualizing module is configured to adjust the visual appearance of the three-dimensional model of the object when the three-dimensional model of the object is selected by the user for moving, with the moving module, the position of the three-dimensional model of the object.

16. A system for visualization of a three-dimensional model of an object in a two-dimensional environment, the system comprising:
 a processor; and
 a storage device, the storage device containing instructions executable by the processor comprising:
  a receiving module configured to receive one or more requests from a user, the requests including one or more of an import request, a scale data request, a superimposing request, a replacement request, and a request to save a resulting image;
  an importing module configured to import, based on the import request of the user, the two-dimensional environment;
  a superimposing module configured to superimpose, based on the superimposing request, the three-dimensional model of the object onto the two-dimensional environment with a scale and a perspective based on the two-dimensional environment;
  a replacement module configured to remove, based on the replacement request, the three-dimensional model of the object and superimpose a second three-dimensional model of a second object at a same position as the first three-dimensional model within the two-dimensional environment;
  a visualizing module configured to display a playback animation of the three-dimensional model of the object wherein a scale and a perspective of the playback animation is based on a position of the three-dimensional model of the object in the two-dimensional environment, the visualizing module further configured to adjust a visual appearance of the three-dimensional model of the object when the three-dimensional model of the object is selected by the user for modification and generate an audible tone, wherein the audible tone is adjusted based on the position of the three-dimensional model of the object within the two-dimensional environment and based on acoustic properties of the two-dimensional environment;
  a saving module configured to save the resulting image, based on the request to save the resulting image, wherein the resulting image includes the three-dimensional model of the object superimposed onto the two-dimensional environment;
  an uploading module configured to upload the resulting image to a social network; and
  a purchasing module configured to receive a purchasing request for the object.

17. The system of claim 16, wherein the visualizing module is further configured to adjust the audible tone based on the scale and the perspective of the two-dimensional environment.

18. The system of claim 17, wherein the receiving module is further configured to receive an updated position of the three-dimensional model of the object within the two-dimensional environment, and wherein the visualizing module is further configured to visualize an updated resulting image including the three-dimensional model of the object superimposed onto the two-dimensional environment at the updated position, and adjust the audible tone according to a change in relationship between a point of view of the user and the updated position of the three-dimensional model of the object.

19. The system of claim 16, wherein the visualizing module is configured to increase or decrease a shading of the three-dimensional model of the object when the three-dimensional model of the object is selected by the user for one of positioning in the two-dimensional environment and replacing with another three-dimensional model.

20. The system of claim 16, wherein the visualizing module is configured to visualize an outer boundary color on an outer boundary of the three-dimensional model of the object when the three-dimensional model of the object is selected by the user for modification.

* * * * *